(12) United States Patent
Suzuki

(10) Patent No.: US 11,237,055 B2
(45) Date of Patent: Feb. 1, 2022

(54) IMAGING DEVICE AND SPECTRUM ANALYSIS APPARATUS

(71) Applicant: SONY SEMICONDUCTOR SOLUTIONS CORPORATION, Kanagawa (JP)

(72) Inventor: Misao Suzuki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/250,319

(22) PCT Filed: Jun. 12, 2019

(86) PCT No.: PCT/JP2019/023198
§ 371 (c)(1),
(2) Date: Jan. 4, 2021

(87) PCT Pub. No.: WO2020/012854
PCT Pub. Date: Jan. 16, 2020

(65) Prior Publication Data
US 2021/0156740 A1    May 27, 2021

(30) Foreign Application Priority Data
Jul. 12, 2018 (JP) .............................. JP2018-132139

(51) Int. Cl.
*G01J 3/28* (2006.01)
(52) U.S. Cl.
CPC ........... *G01J 3/2803* (2013.01); *G01J 3/2823* (2013.01); *G01J 2003/2813* (2013.01)

(58) Field of Classification Search
CPC .................. G01J 3/2803; G01J 3/2823; G01J 2003/2813; G01J 3/14; G01J 3/36;
(Continued)

(56) References Cited

U.S. PATENT DOCUMENTS

| 5,105,264 A | 4/1992 | Erhardt et al. |
| 5,898,509 A | 4/1999 | Bianchi et al. |

(Continued)

FOREIGN PATENT DOCUMENTS

| CN | 101079966 A | 11/2007 |
| EP | 574390 A1 | 12/1993 |

(Continued)

OTHER PUBLICATIONS

International Search Report and Written Opinion of PCT Application No. PCT/JP2019/023198, dated Sep. 20, 2019, 11 pages of ISRWO.

*Primary Examiner* — Abdullahi Nur
(74) *Attorney, Agent, or Firm* — Chip Law Group

(57) ABSTRACT

An imaging device of the present disclosure includes: a plurality of pixels arranged side by side in a first direction and a second direction and each including a light receiving element; and a drive section configured to drive the plurality of pixels. Of the plurality of pixels, ones arranged side by side in the first direction have respective light receiving sensitivities equal to each other. Of the plurality of pixels, ones arranged side by side in the second direction include a first pixel and a second pixel each having a light receiving sensitivity, the light receiving sensitivity of the first pixel and the light receiving sensitivity of the second pixel being different from each other.

13 Claims, 16 Drawing Sheets

(58) Field of Classification Search
CPC ............ H04N 5/35563; H04N 5/35554; H01L 27/146; H01L 31/02
See application file for complete search history.

(56) References Cited

U.S. PATENT DOCUMENTS

| | | | |
|---|---|---|---|
| 2006/0146163 | A1 | 7/2006 | Uemura |
| 2008/0173794 | A1 | 7/2008 | Oike et al. |
| 2017/0201693 | A1* | 7/2017 | Sugizaki ........... H01L 27/14627 |

FOREIGN PATENT DOCUMENTS

| | | | |
|---|---|---|---|
| EP | 776123 | A2 | 5/1997 |
| EP | 1819151 | A1 | 8/2007 |
| JP | 63-138866 | A | 6/1988 |
| JP | 06-501824 | A | 2/1994 |
| JP | 09-018888 | A | 1/1997 |
| JP | 09-205520 | A | 8/1997 |
| JP | 10-136273 | A | 5/1998 |
| JP | 2003-143485 | A | 5/2003 |
| JP | 2003-274422 | A | 9/2003 |
| JP | 2006-190790 | A | 7/2006 |
| JP | 2007-214832 | A | 8/2007 |
| JP | 2009-022041 | A | 1/2009 |
| JP | 2009-194604 | A | 8/2009 |
| KR | 10-2007-0081107 | A | 8/2007 |
| TW | 324076 | B | 1/1998 |
| TW | 388006 | B | 4/2000 |
| TW | 200746804 | A | 12/2007 |
| WO | 1992/006564 | A1 | 4/1992 |

* cited by examiner

[FIG. 1]
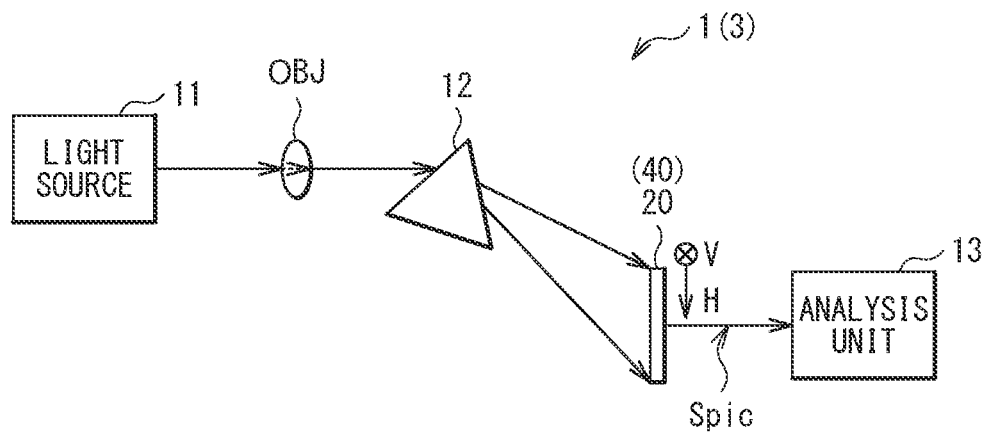
[FIG. 2A]
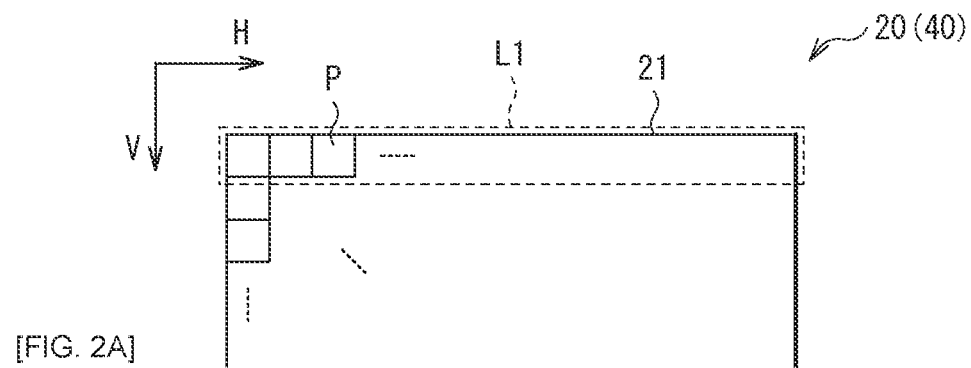
[FIG. 2B]
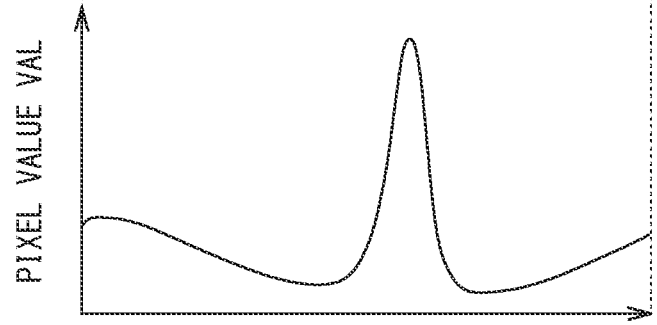

[FIG. 3]
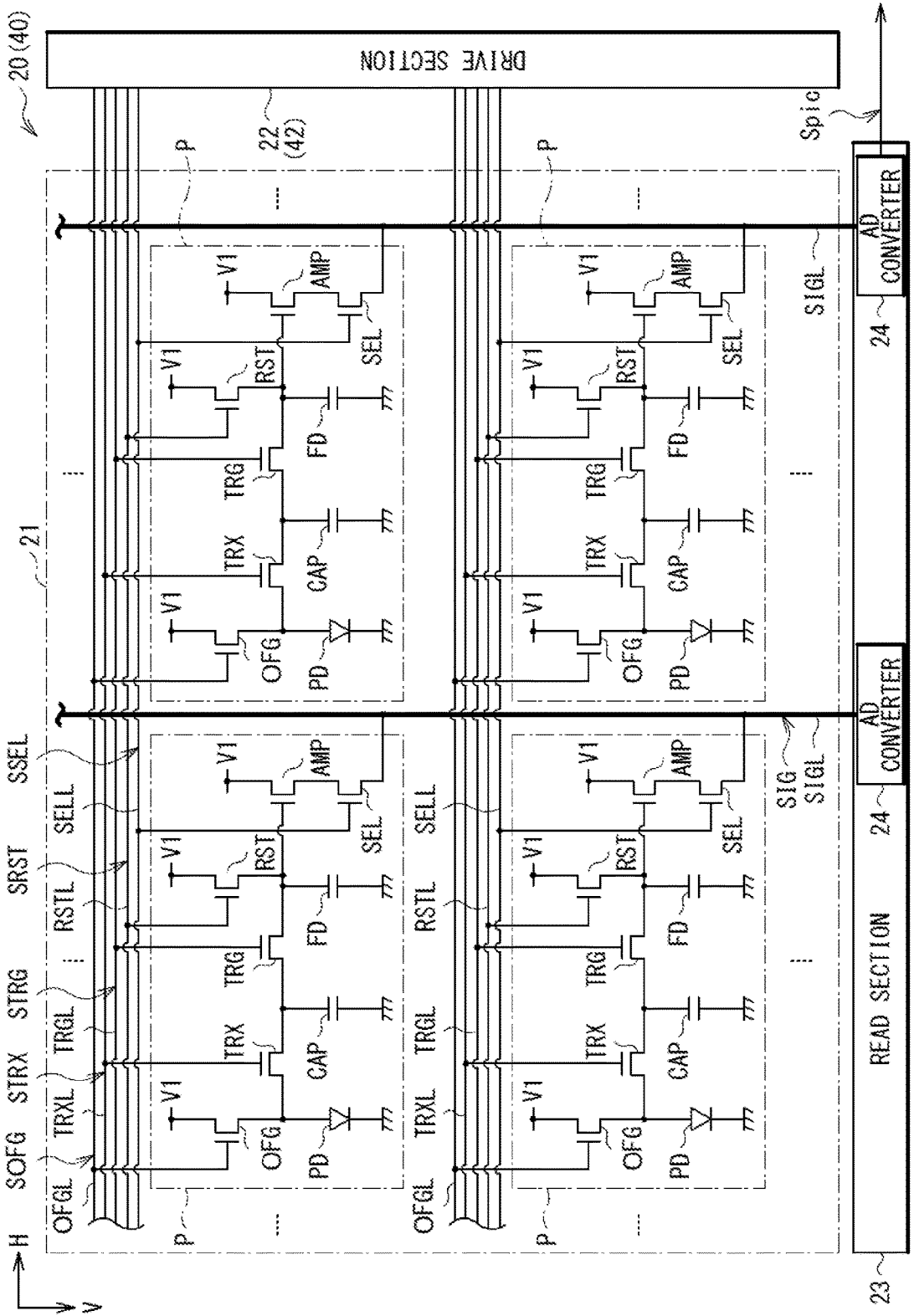

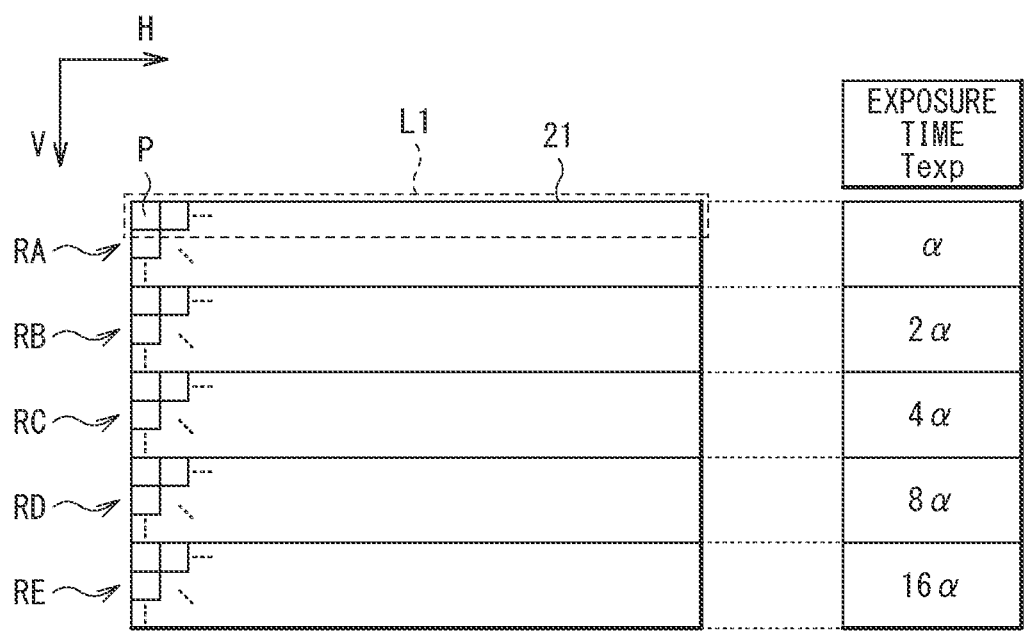
[FIG. 4]

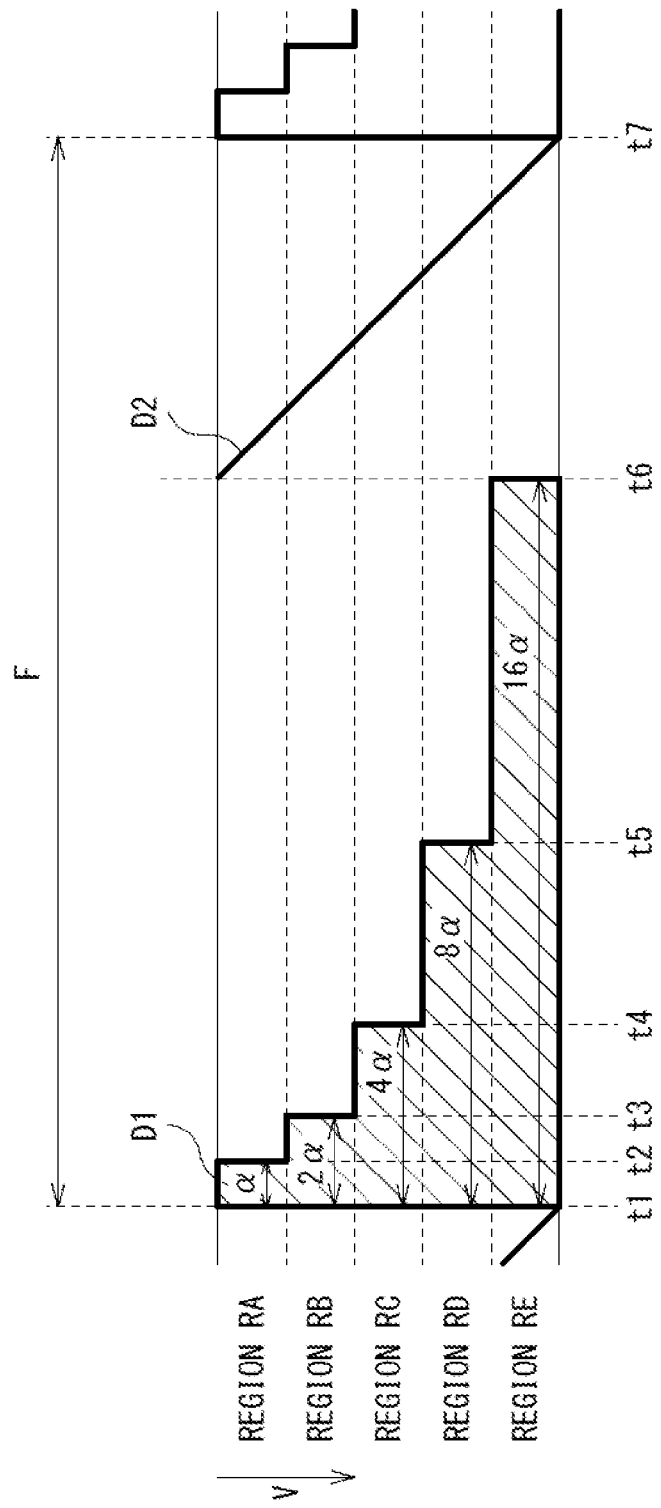
[FIG. 5]

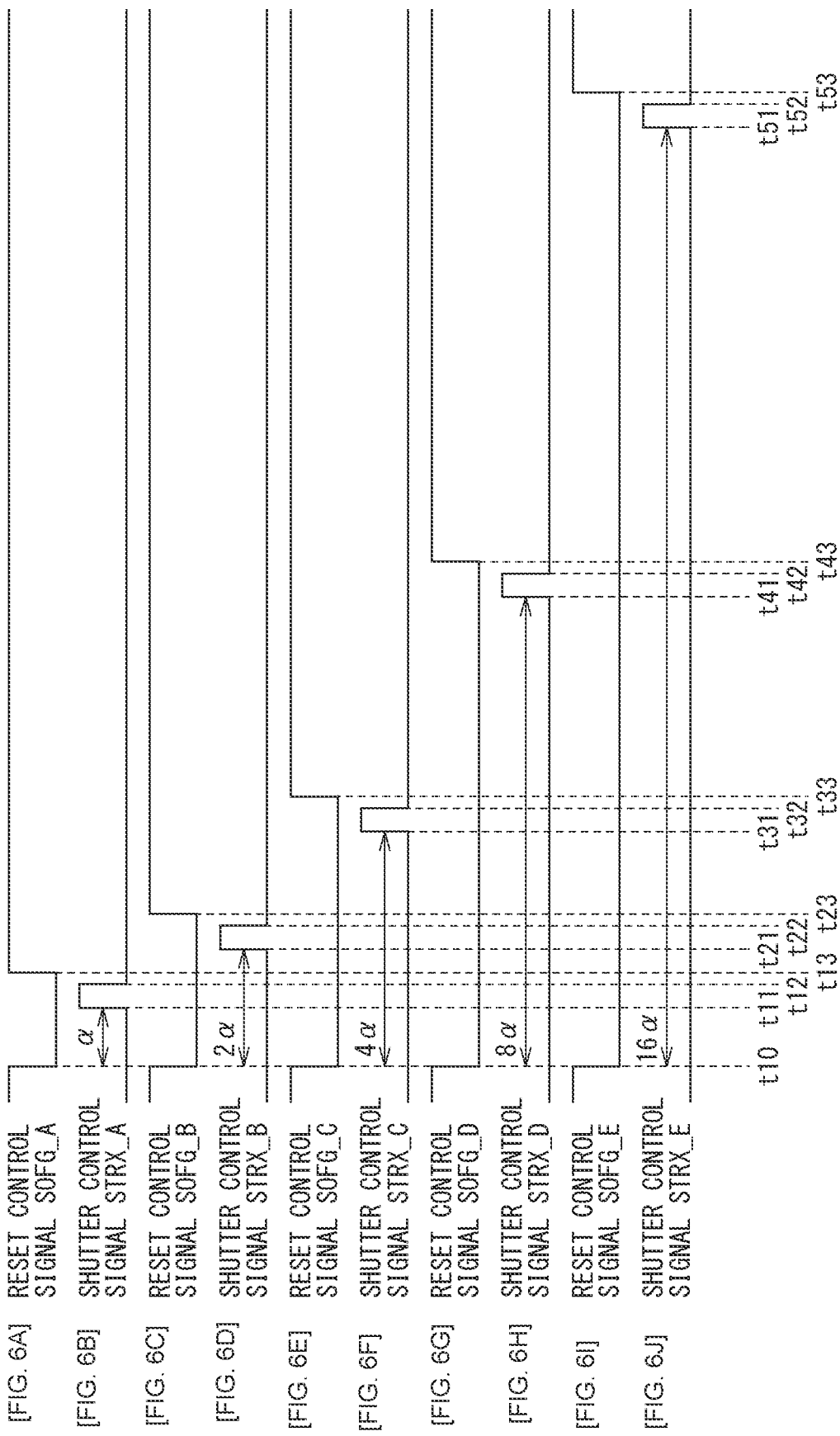

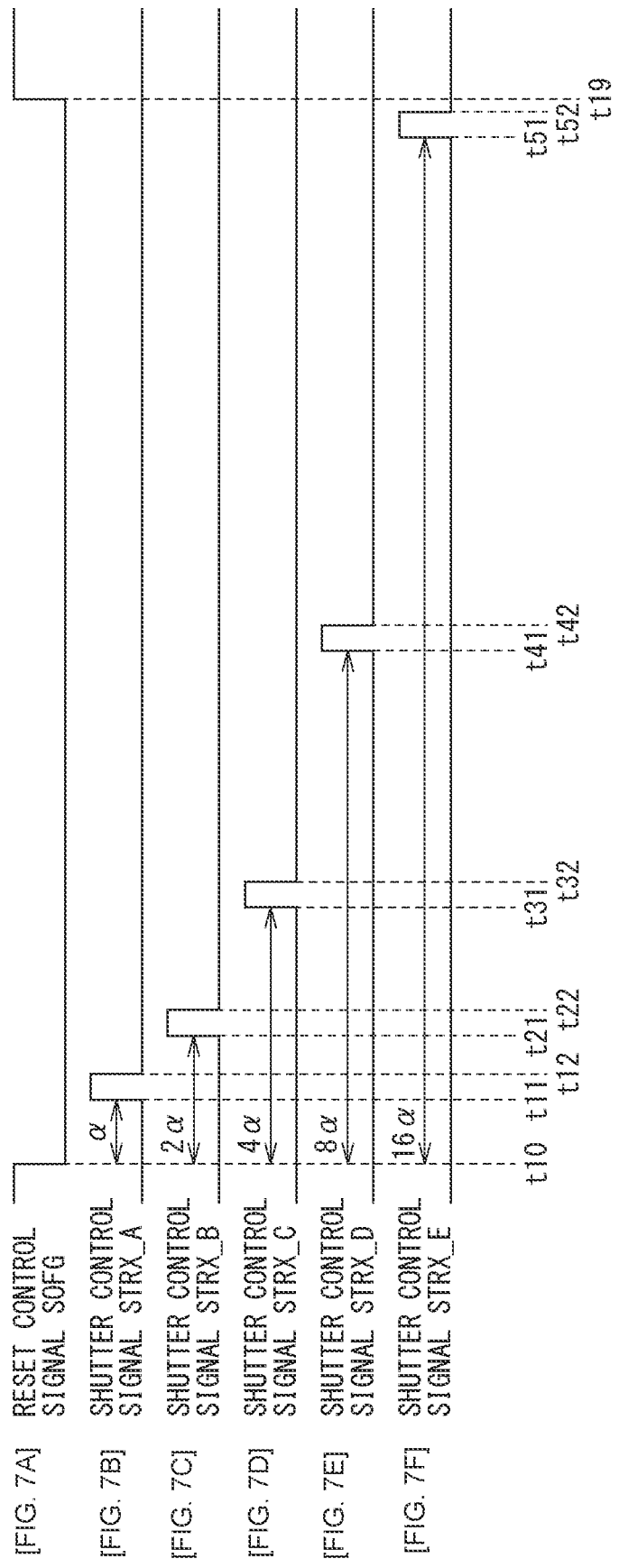

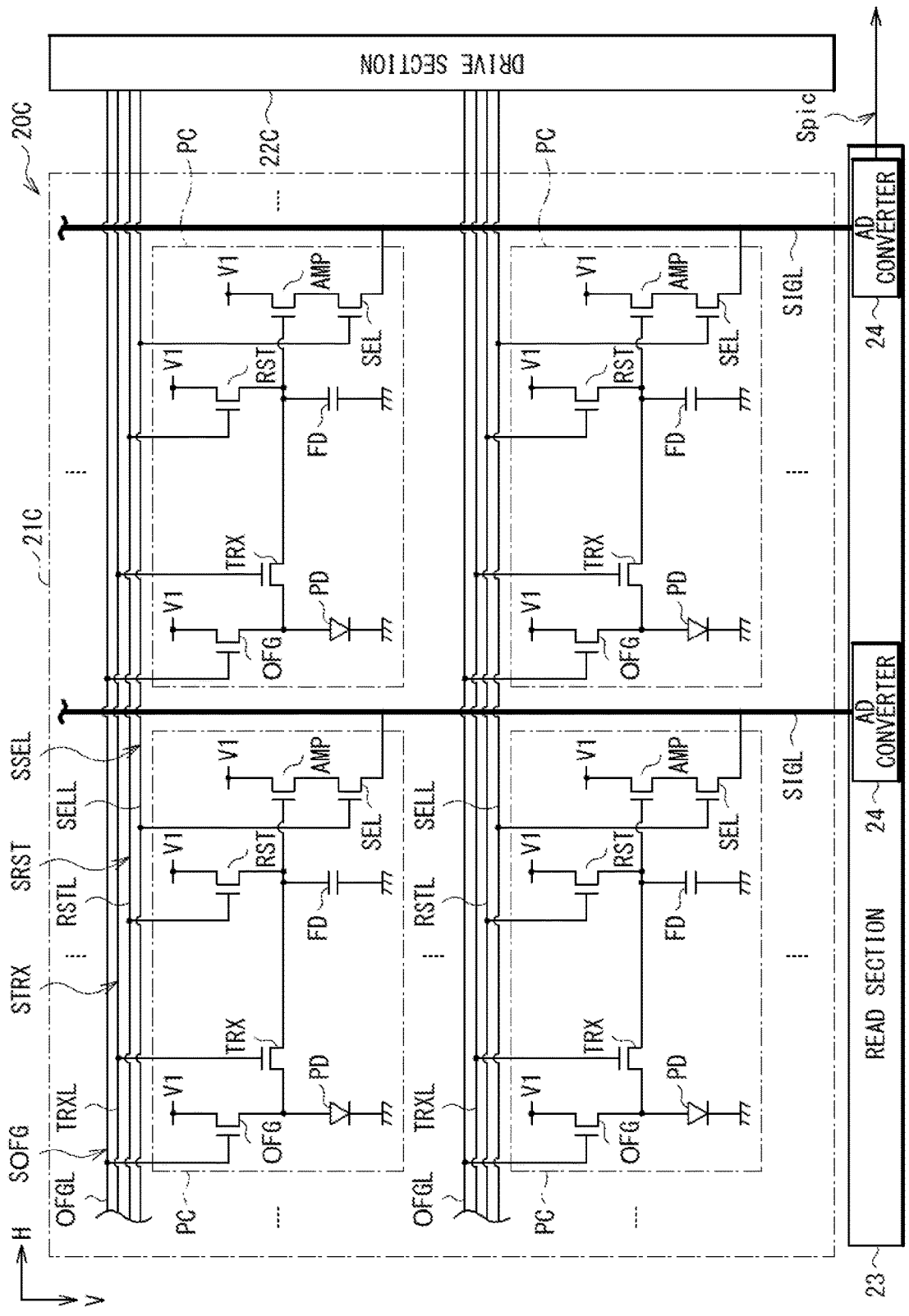

[FIG. 9]
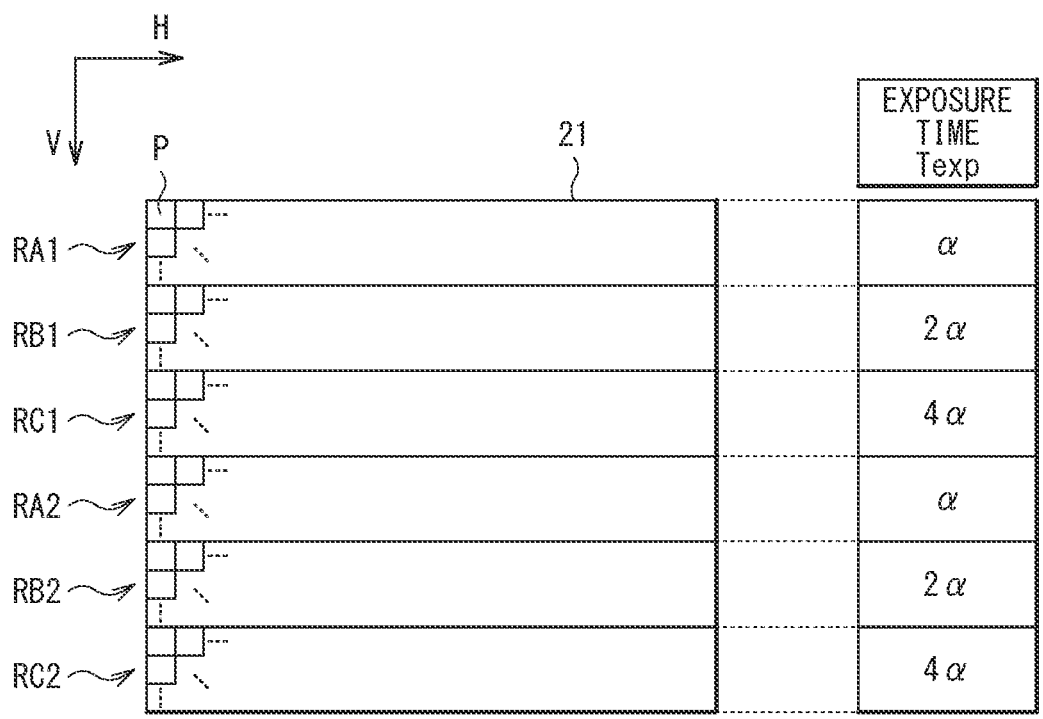

[FIG. 10]
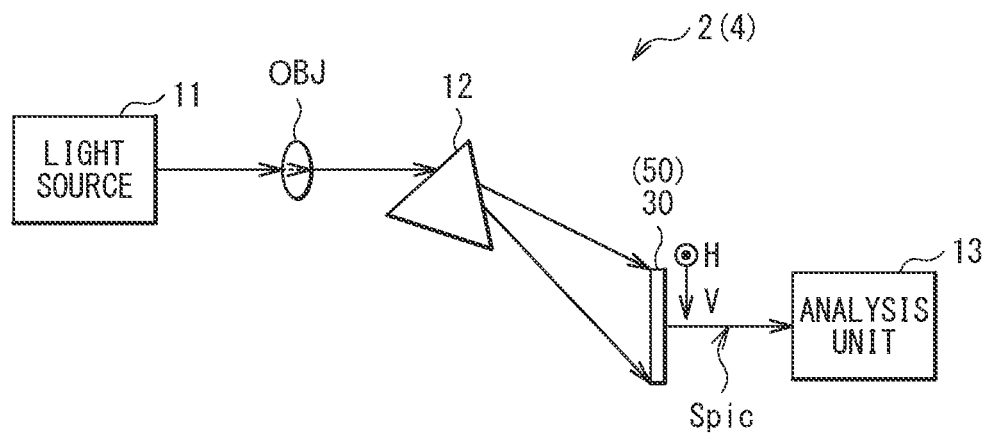
[FIG. 11A]     [FIG. 11B]
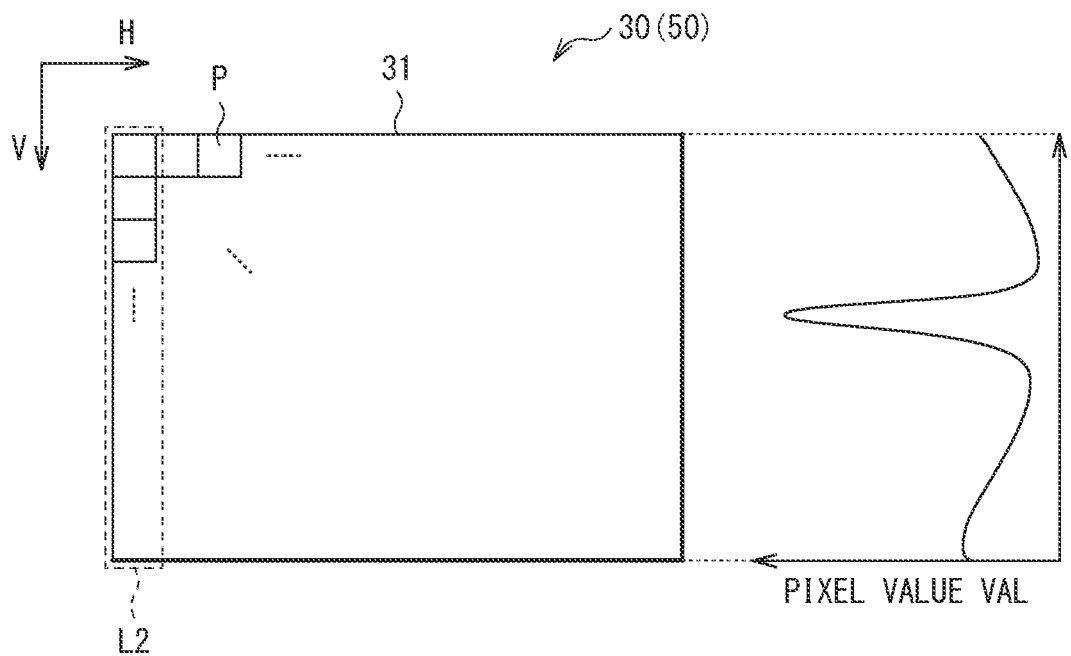

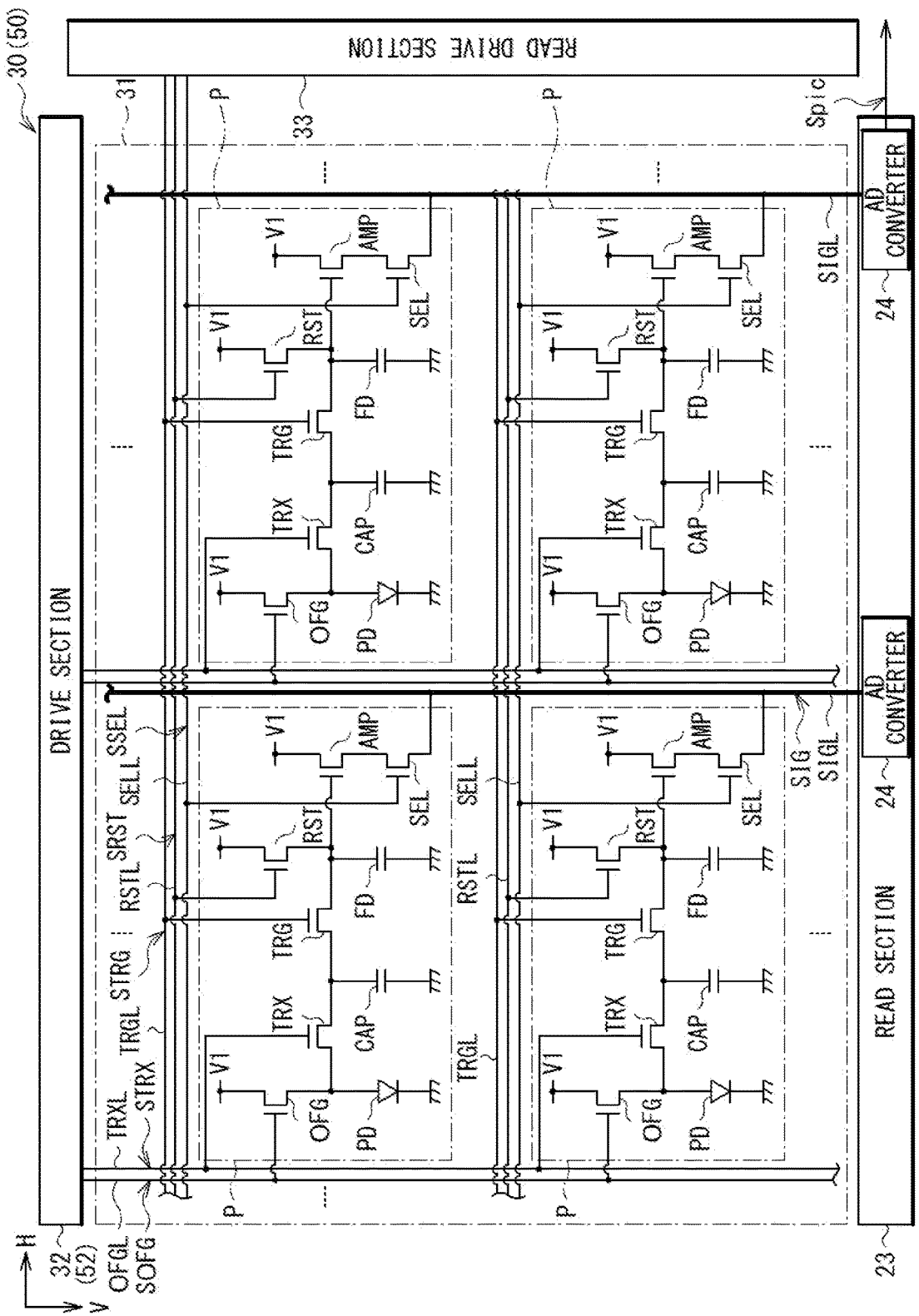
[FIG. 12]

[FIG. 13]
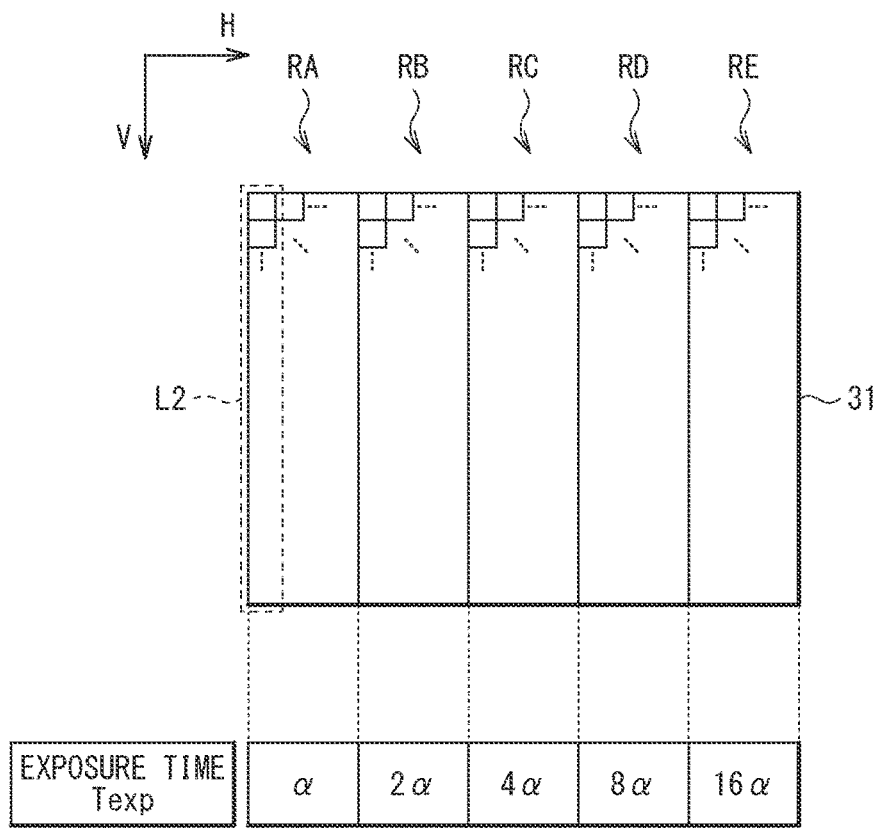
[FIG. 14]
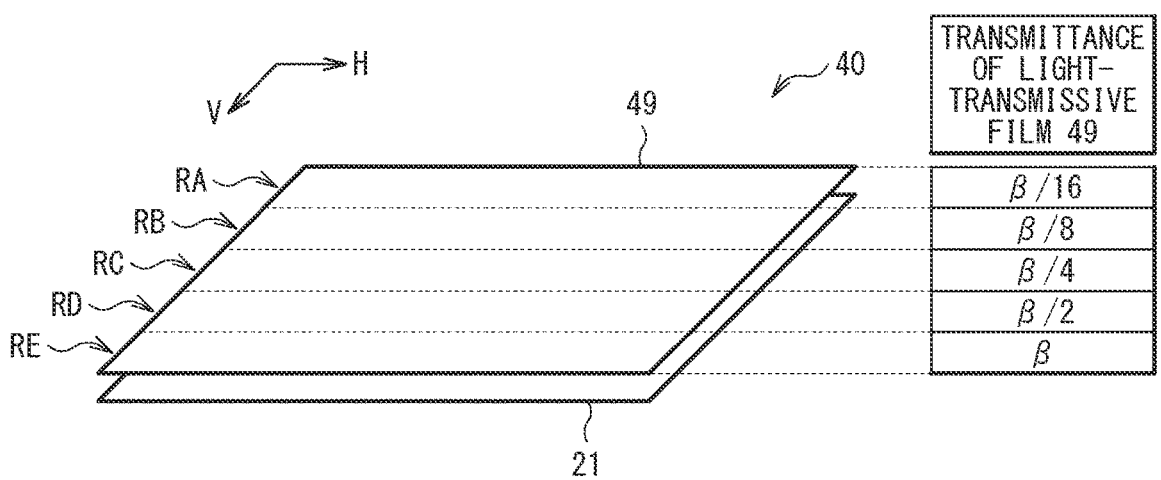

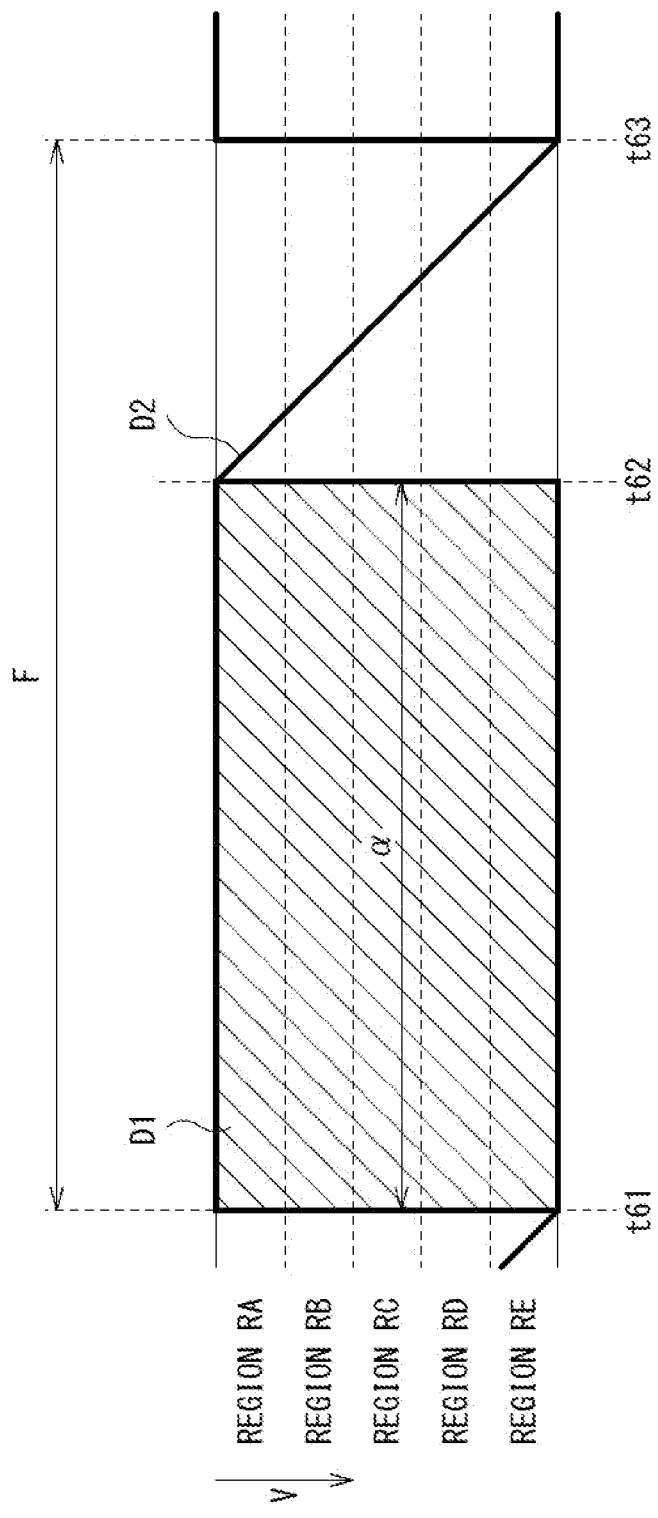
[FIG. 15]

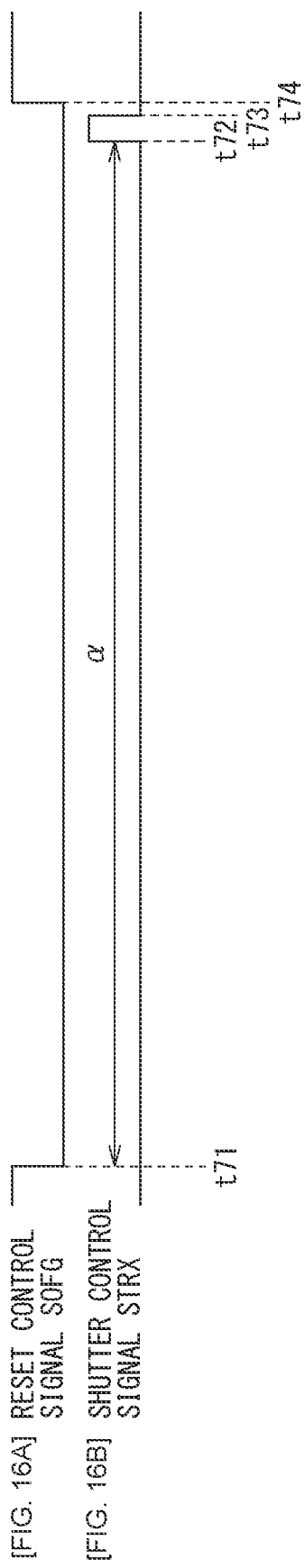

[FIG. 17]
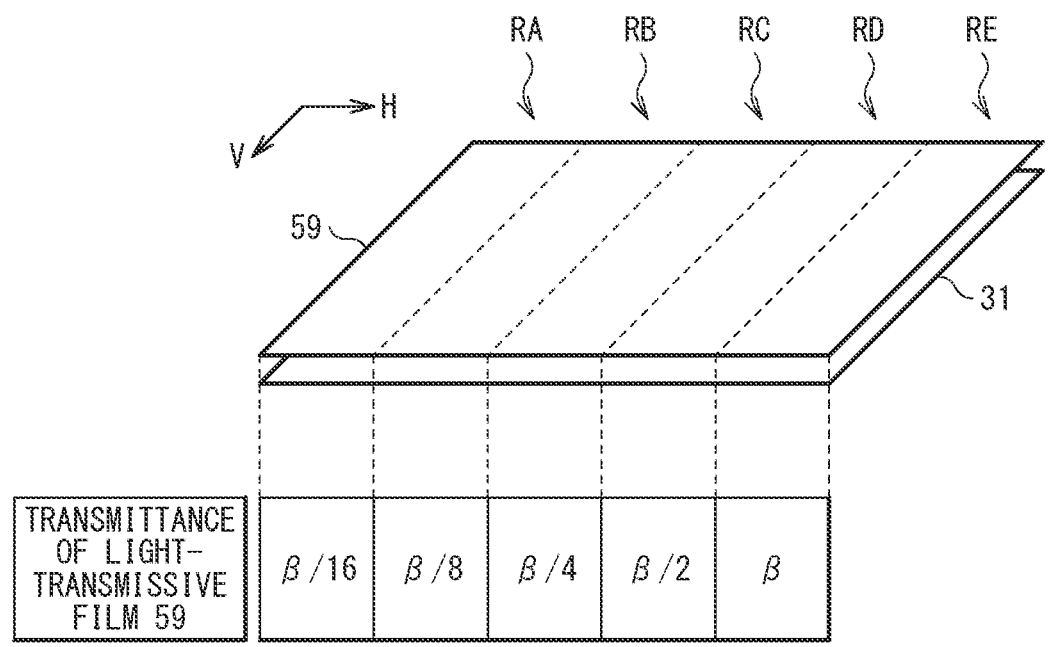

[FIG. 18]
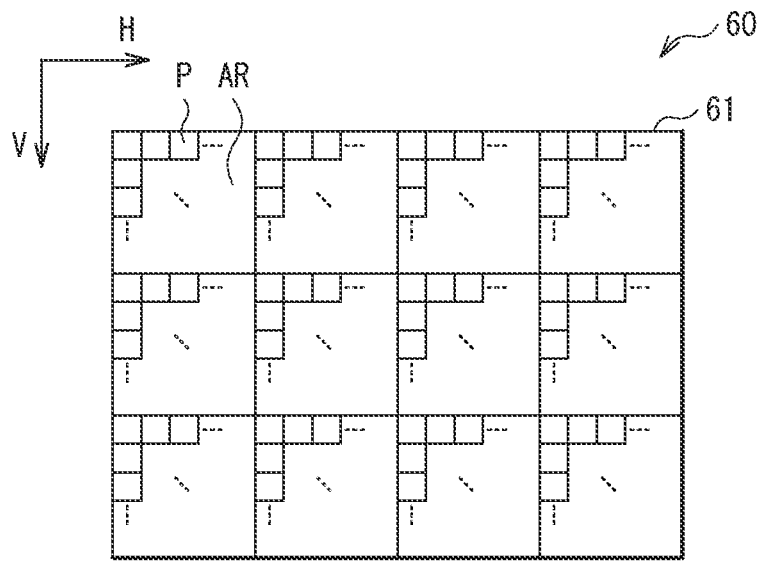
[FIG. 19]
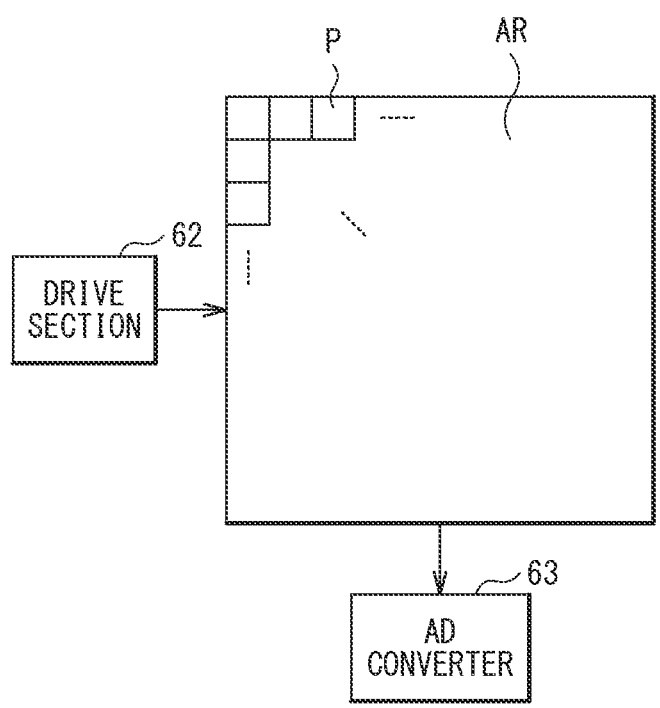

[FIG. 20]
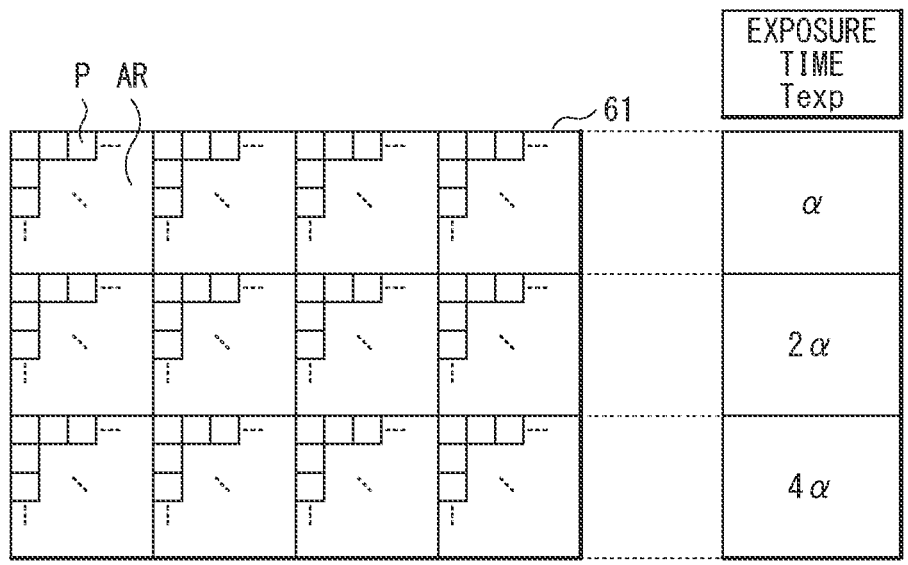
[FIG. 21]
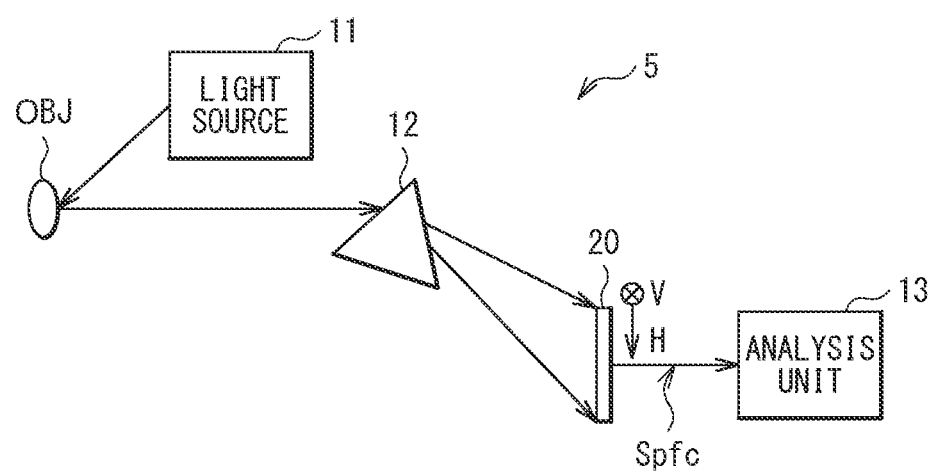

IMAGING DEVICE AND SPECTRUM ANALYSIS APPARATUS

CROSS REFERENCE TO RELATED APPLICATIONS

This application is a U.S. National Phase of International Patent Application No. PCT/JP2019/023198 filed on Jun. 12, 2019, which claims priority benefit of Japanese Patent Application No. JP 2018-132139 filed in the Japan Patent Office on Jul. 12, 2018. Each of the above-referenced applications is hereby incorporated herein by reference in its entirety.

TECHNICAL FIELD

The present disclosure relates to an imaging device to be used for spectrum analysis, and a spectrum analysis apparatus.

BACKGROUND ART

Some imaging devices are able to cause an exposure time for some of a plurality of pixels to be different from that for the other pixels. For example, PTL 1 discloses a solid-state imaging device that allows for choosing a shutter speed in any region.

CITATION LIST

Patent Literature

PTL 1: Japanese Unexamined Patent Application Publication No. 2003-143485

SUMMARY OF THE INVENTION

Meanwhile, in spectrum analysis, spectra of light resulting from spectral dispersion by, for example, a prism, are detected by an imaging device. It is desired that the imaging device to be used for spectrum analysis be high in light detection accuracy.

It is desirable to provide an imaging device and a spectrum analysis apparatus that make it possible to increase the detection accuracy.

An imaging device of an embodiment of the present disclosure includes a plurality of pixels and a drive section. The plurality of pixels is arranged side by side in a first direction and a second direction, and each includes a light receiving element. The drive section is configured to drive the plurality of pixels. Of the plurality of pixels, ones arranged side by side in the first direction have respective light receiving sensitivities equal to each other. Of the plurality of pixels, ones arranged side by side in the second direction include a first pixel and a second pixel each having a light receiving sensitivity, the light receiving sensitivity of the first pixel and the light receiving sensitivity of the second pixel being different from each other.

A spectrum analysis apparatus of an embodiment of the present disclosure includes a spectroscope, a plurality of pixels, and a drive section. The plurality of pixels is disposed to allow light outputted by the spectroscope to enter, is arranged side by side in a first direction and a second direction, and each includes a light receiving element. The drive section is configured to drive the plurality of pixels. Pieces of light outputted by the spectroscope and having wavelengths different from each other are configured to enter ones of the plurality of pixels arranged side by side in the first direction. Pieces of light outputted by the spectroscope and having wavelengths equal to each other are configured to enter ones of the plurality of pixels arranged side by side in the second direction. Of the plurality of pixels, the ones arranged side by side in the first direction have respective light receiving sensitivities equal to each other. Of the plurality of pixels, ones arranged side by side in the second direction include a first pixel and a second pixel each having a light receiving sensitivity, the light receiving sensitivity of the first pixel and the light receiving sensitivity of the second pixel being different from each other.

In the imaging device and the spectrum analysis apparatus of the respective embodiments of the present disclosure, light is detected at the plurality of pixels arranged side by side in the first direction and the second direction and each including the light receiving element. Of the plurality of pixels, the ones arranged side by side in the first direction have their respective light receiving sensitivities equal to each other. Of the plurality of pixels, the ones arranged side by side in the second direction include the first pixel and the second pixel that have their respective light receiving sensitivities different from each other.

According to the imaging device and the spectrum analysis apparatus of the respective embodiments of the disclosure, of the plurality of pixels, the ones arranged side by side in the first direction have their respective light receiving sensitivities equal to each other, and the ones arranged side by side in the second direction include the first pixel and the second pixel that have their respective light receiving sensitivities different from each other. Accordingly, it is possible to increase the detection accuracy. It is to be noted that the effects described here are not necessarily limitative, and any of effects described in the present disclosure may be provided.

BRIEF DESCRIPTION OF DRAWINGS

FIG. 1 is a block diagram illustrating a configuration example of a spectrum analysis apparatus according to an embodiment of the present disclosure.

FIGS. 2A and 2B are explanatory diagrams illustrating a configuration example of an imaging unit illustrated in FIG. 1.

FIG. 3 is a circuit diagram illustrating a configuration example of the imaging unit illustrated in FIG. 1.

FIG. 4 is an explanatory diagram illustrating an operation example of a drive section according to a first embodiment.

FIG. 5 is a timing chart illustrating an operation example of the imaging unit according to the first embodiment.

FIGS. 6A, 6B, 6C, 6D, 6E, 6F, 6G, 6H, 6I, and 6J are timing waveform chart illustrating an operation example of the imaging unit according to the first embodiment.

FIGS. 7A, 7B, 7C, 7D, 7E, and 7F are timing waveform chart illustrating an operation example of an imaging unit according to a modification example of the first embodiment.

FIG. 8 is a circuit diagram illustrating a configuration example of an imaging unit according to another modification example of the first embodiment.

FIG. 9 is an explanatory diagram illustrating an operation example of a drive section according to another modification example of the first embodiment.

FIG. 10 is a block diagram illustrating a configuration example of a spectrum analysis apparatus according to an embodiment of the disclosure.

FIGS. 11A and 11B are explanatory diagrams illustrating a configuration example of the imaging unit illustrated in FIG. 10.

FIG. 12 is a circuit diagram illustrating a configuration example of the imaging unit illustrated in FIG. 10.

FIG. 13 is an explanatory diagram illustrating an operation example of a drive section according to a second embodiment.

FIG. 14 is an explanatory diagram illustrating a configuration example of an imaging unit according to a third embodiment.

FIG. 15 is a timing chart illustrating an operation example of the imaging unit according to the third embodiment.

FIGS. 16A and 16B are timing waveform chart illustrating an operation example of the imaging unit according to the third embodiment.

FIG. 17 is an explanatory diagram illustrating a configuration example of an imaging unit according to a modification example of the third embodiment.

FIG. 18 is an explanatory diagram illustrating a configuration example of an imaging unit according to a modification example.

FIG. 19 is an explanatory diagram illustrating a configuration example of the imaging unit illustrated in FIG. 18.

FIG. 20 is an explanatory diagram illustrating an operation example of the imaging unit illustrated in FIG. 18.

FIG. 21 is a block diagram illustrating a configuration example of a spectrum analysis apparatus according to another modification example.

MODES FOR CARRYING OUT THE INVENTION

In the following, some embodiments of the present disclosure are described in detail with reference to the drawings. It is to be noted that the descriptions are given in the following order.
1. First Embodiment (an example of setting a light receiving sensitivity by using an exposure time)
2. Second Embodiment (an example of setting the light receiving sensitivity by using the exposure time)
3. Third Embodiment (an example of setting the light receiving sensitivity by using a transmittance of a light-transmissive film)

1. First Embodiment

Configuration Example

FIG. 1 illustrates a configuration example of a spectrum analysis apparatus (a spectrum analysis apparatus 1) according to an embodiment. The spectrum analysis apparatus 1 includes a light source 11, a prism 12, an imaging unit 20, and an analysis unit 13.

The light source 11 outputs white light including infrared light toward a measurement target object OBJ. The infrared light includes, for example, short wave infrared (SWIR; Short Wave Infrared) light. The measurement target object OBJ is a measurement target for spectrum analysis, and absorbs, for example, light in one or a plurality of wavelength regions depending on a material included in the measurement target object OBJ. Then, the remaining light enters the prism 12 as transmitted light.

The prism 12 spectrally disperses light transmitted through the measurement target object OBJ to thereby output continuous spectrum light in a direction corresponding to a wavelength. Then, the continuous spectrum light enters the imaging unit 20.

The imaging unit 20 detects the continuous spectrum light outputted by the prism 12. The imaging unit 20 is a sensor configured to detect infrared light, and is configured with a CMOS (Complementary Metal Oxide Semiconductor) image sensor, an infrared sensor using a compound, or the like. The imaging unit 20 performs an imaging operation by a global shutter method.

FIG. 2A schematically illustrates a configuration example of the imaging unit 20, and FIG. 2B illustrates an example of pixel values VAL obtained in the imaging unit 20. The imaging unit 20 includes a pixel array 21. The pixel array 21 includes a plurality of pixels P arranged in a matrix. FIG. 2B illustrates the pixel values VAL obtained by a single row of pixels P illustrated in FIG. 2A.

In FIG. 2A, a horizontal direction is an H direction, and a vertical direction is a V direction. As illustrated in FIG. 1, pieces of light having different wavelengths included in the continuous spectrum light outputted by the prism 12 respectively enter ones of the plurality of pixels P arranged side by side in the H direction. Further, pieces of light having equal wavelengths respectively enter ones of the plurality of pixels P arranged side by side in the V direction. This makes it possible for the imaging unit 20 to obtain a spectrum corresponding to the measurement target object OBJ as illustrated in FIG. 2B on the basis of results of detection by the ones of the plurality of pixels P arranged side by side in the H direction.

FIG. 3 illustrates a configuration example of the imaging unit 20. The imaging unit 20 includes a drive section 22 and a read section 23 in addition to the pixel array 21.

The pixel array 21 includes a plurality of reset control lines OFGL, a plurality of shutter control lines TRXL, a plurality of transfer control lines TRGL, a plurality of reset control lines RSTL, a plurality of selection control lines SELL, and a plurality of signal lines SIGL. Each of the plurality of reset control lines OFGL extends in the horizontal direction in FIG. 3, and has one end coupled to the drive section 22. A reset control signal SOFG is applied to each of the reset control lines OFGL by the drive section 22. Each of the plurality of shutter control lines TRXL extends in the horizontal direction in FIG. 3, and has one end coupled to the drive section 22. A shutter control signal STRX is applied to each of the shutter control lines TRXL by the drive section 22. Each of the plurality of transfer control lines TRGL extends in the horizontal direction in FIG. 3, and has one end coupled to the drive section 22. A transfer control signal STRG is applied to each of the transfer control lines TRGL by the drive section 22. Each of the plurality of reset control lines RSTL extends in the horizontal direction in FIG. 3, and has one end coupled to the drive section 22. A reset control signal SRST is applied to each of the reset control lines RSTL by the drive section 22. Each of the plurality of selection control lines SELL extends in the horizontal direction in FIG. 3, and has one end coupled to the drive section 22. A selection control signal SSEL is applied to each of the plurality of selection control lines SELL by the drive section 22. Each of the plurality of signal lines SIGL extends in the vertical direction in FIG. 3, and has one end coupled to the read section 23. In FIGS. 2 and 3, a single row of pixels P arranged side by side in the horizontal direction (the H direction) constitutes a pixel line L1.

Each pixel P generates a pixel voltage corresponding to an amount of received light. Each pixel P includes a light receiving element PD, transistors OFG and TRX, a capacitive element CAP, a transistor TRG, a floating diffusion FD, and transistors RST, AMP, and SEL. The transistors OFG, TRX, TRG, RST, AMP, and SEL are N-type MOS (Metal Oxide Semiconductor) transistors.

The light receiving element PD is a photoelectric conversion element that generates an amount of charges corresponding to the amount of received light and accumulates the charges, and includes, for example, a photodiode. An anode of the light receiving element PD is grounded, and a cathode of the light receiving element PD is coupled to a source of each of the transistors OFG and TRX.

A drain of the transistor OFG is supplied with a voltage V1, a gate of the transistor OFG is coupled to the reset control line OFGL, and the source of the transistor OFG is coupled to the cathode of the light receiving element PD and the source of the transistor TRX.

The source of the transistor TRX is coupled to the source of the transistor OFG and the cathode of the light receiving element PD, a gate of the transistor TRX is coupled to the shutter control line TRXL, and a drain of the transistor TRX is coupled to one end of the capacitive element CAP and a source of the transistor TRG.

The capacitive element CAP accumulates the charges transferred from the light receiving element PD through the transistor TRX. The one end of the capacitive element CAP is coupled to the drain of the transistor TRX and the source of the transistor TRG, and another end of the capacitive element CAP is grounded.

The source of the transistor TRG is coupled to the drain of the transistor TRX and the one end of the capacitive element CAP, a gate of the transistor TRG is coupled to the transfer control line TRGL, and a drain of the transistor TRG is coupled to the floating diffusion FD, a source of the transistor RST, and a gate of the transistor AMP.

The floating diffusion FD accumulates the charges transferred from the light receiving element PD through the transistors TRX and TRG, and includes, for example, a diffusion layer formed on a surface of a semiconductor substrate. In FIG. 3, the floating diffusion FD is represented by a symbol of a capacitive element.

A drain of the transistor RST is supplied with a voltage V1, a gate of the transistor RST is coupled to the reset control line RSTL, and the source of the transistor RST is coupled to the drain of the transistor TRG, the floating diffusion FD, and the gate of the transistor AMP.

A drain of the transistor AMP is supplied with a voltage V1, the gate of the transistor AMP is coupled to the drain of the transistor TRG, the floating diffusion FD, and the source of the transistor RST, and a source of the transistor AMP is coupled to a drain of the transistor SEL.

The drain of the transistor SEL is coupled to the source of the transistor AMP, a gate of the transistor SEL is coupled to the selection control line SELL, and a source of the transistor SEL is coupled to the signal line SIGL.

With this configuration, in each pixel P, in an exposure operation the light receiving element PD generates and accumulates an amount of charges corresponding to the amount of received light. Then, the transistor TRX is turned on to thereby cause the charges generated by the light receiving element PD to be transferred to the capacitive element CAP. Thereafter, in a read operation, the transistor TRG is turned on to thereby cause the charges in the capacitive element CAP to be transferred to the floating diffusion FD, and also the transistor SEL is turned on to thereby cause the pixel P to be electrically coupled to the signal line SIGL. The transistor AMP is thereby coupled to the read section 23 and operates as a so-called source follower. Then, the pixel P outputs a pixel voltage corresponding to a voltage at the floating diffusion FD as a signal SIG to the signal line SIGL.

The drive section 22 drives the pixels P in the pixel array 21. Specifically, the drive section 22 applies a plurality of reset control signals SOFG respectively to the plurality of reset control lines OFGL in the pixel array 21, applies a plurality of shutter control signals STRX respectively to the plurality of shutter control lines TRXL, applies a plurality of transfer control signals STRG respectively to the plurality of transfer control lines TRGL, applies a plurality of reset control signals SRST respectively to the plurality of reset control lines RSTL, and applies a plurality of selection control signals SSEL respectively to the plurality of selection control lines SELL, thereby driving the pixel array 21 on a per-pixel-line-L1 basis. The drive section 22 performs exposure driving D1 and read driving D2 on the pixel array 21.

By performing the exposure driving D1, the drive section 22 causes each of the plurality of pixels P in the pixel array 21 to perform the exposure operation to accumulate charges corresponding to the amount of received light. In the exposure driving D1, the drive section 22 is able to set an exposure time Texp on a per-pixel-line-L1 basis as described below.

FIG. 4 illustrates an example of setting of the exposure time Texp. In this example, the pixel array 21 is divided into five regions R (regions RA to RE) arranged side by side in the V direction. The region RA, the region RB, the region RC, the region RD, and the region RE are arranged in this order from the top in FIG. 4. The pixel array 21 includes a plurality of pixel lines L1 in each of the plurality of regions R. The respective numbers of the pixel lines L1 in the five regions R may be equal to each other or different from one region R to another.

In this example, the drive section 22 sets the exposure time Texp for the pixels P included in the region RA to a time $\alpha(=2^0 \times \alpha)$. The time $\alpha$ is a predetermined period of time. Further, the drive section 22 sets the exposure time Texp for the pixels P included in the region RB to a time $2\alpha(=2^1 \times \alpha)$, sets the exposure time Texp for the pixels P included in the region RC to a time $4\alpha(=2^2 \times \alpha)$, sets the exposure time Texp for the pixels P included in the region RD to a time $8\alpha(=2^3 \times \alpha)$, and sets the exposure time Texp for the pixels P included in the region RD to a time $16\alpha(=2^4 \times \alpha)$. More specifically, the drive section 22 sets the exposure time Texp for the pixels P included in each of the five regions RA to RE to a time proportional to a power of 2. As a result, a light receiving sensitivity of the pixels P included in each of the five regions RA to RE is also proportional to a power of 2. More specifically, the pixels P included in the region RA have the lowest light receiving sensitivity, and the pixels P included in the region RE have the highest light receiving sensitivity. This makes it possible for the spectrum analysis apparatus 1 to achieve a wide dynamic range.

The drive section 22 is able to change the time $\alpha$, and is also able to change the number of the regions R. For example, the driving section 22 is able to set two to four regions R, or six or more regions R. In such a case also, the drive section 22 sets the exposure time Texp for each of these plurality of regions R to a time proportional to a power of 2.

Further, by performing the read driving D2, the drive section 22 causes the plurality of pixels P in the pixel array 21 to perform the read operation to supply the pixel voltages corresponding to the amounts of received light to the read section 23.

The read section 23 (FIG. 3) generates an image signal Spic on the basis of the signals SIG supplied from the pixel array 21 through the signal lines SIGL. The read section 23 includes a plurality of AD converters 24. The plurality of AD converters 24 is provided in correspondence with the plurality of signal lines SIGL, respectively. On the basis of the signal SIG supplied through a corresponding one of the signal lines SIGL, each of the plurality of AD converters 24 performs AD conversion of the pixel voltage supplied from each pixel P into a pixel value VAL, which is a digital value. At that time, the AD converters 24 may perform the AD conversion using, for example, correlated double sampling (CDS; Correlated double sampling). Then, the read section 23 generates the image signal Spic on the basis of these pixel values VAL.

The analysis unit 13 performs an analysis process on the basis of the image signal Spic. More specifically, the analysis unit 13 first obtains five spectra S (spectra SA to SE) on the basis of the pixel values VAL obtained in the five regions R (the regions RA to RE), respectively. For example, on the basis of the pixel values VAL obtained from each of the plurality of pixel lines L1 included in the region RA, the analysis unit 13 generates a spectrum corresponding to the pixel line L1. Then, the analysis unit 13 generates a spectrum SA by performing, for example, an averaging process on the basis of a plurality of spectra that respectively correspond to the plurality of pixel lines L1 included in the region RA. In such a manner, by performing the averaging process on the basis of the plurality of spectra, it is possible for the spectrum analysis apparatus 1 to reduce noise in the spectrum SA. Similarly, the analysis unit 13 generates a spectrum SB on the basis of the pixel values VAL in the region RB, generates a spectrum SC on the basis of the pixel values VAL in the region RC, generates a spectrum SD on the basis of the pixel values VAL in the region RD, and generates a spectrum SE on the basis of the pixel values VAL in the region RE. The analysis unit 13 then performs a predetermined analysis process on the basis of these five spectra SA to SE.

Here, the prism 12 corresponds to a specific example of a "spectroscope" in the present disclosure. The pixel P corresponds to a specific example of a "pixel" in the present disclosure. The H direction corresponds to a specific example of a "first direction" in the present disclosure. The V direction corresponds to a specific example of a "second direction" in the present disclosure. The drive section 22 corresponds to a specific example of a "drive section" in the present disclosure. The shutter control signal STRX corresponds to a specific example of a "first control signal" in the present disclosure. The selection control signal SSEL corresponds to a specific example of a "second control signal" in the present disclosure.

Operation and Workings

Next, the operation and workings of the spectrum analysis apparatus 1 of the present embodiment will be described.

Outline of Overall Operation

First, with reference to FIGS. 1, 2A, 2B, and 3, an outline of an overall operation of the spectrum analysis apparatus 1 will be described. The light source 11 (FIG. 1) outputs white light including infrared light toward the measurement target object OBJ. Then, the transmitted light through the measurement target object OBJ enters the prism 12. The prism 12 spectrally disperses the light transmitted through the measurement target object OBJ. The imaging unit 20 detects the continuous spectrum light outputted by the prism 12. In the pixel array 21 (FIGS. 2A and 2B) of the imaging unit 20, pieces of light having different wavelengths respectively enter the ones of the plurality of pixels P arranged side by side in the H direction, and pieces of light having equal wavelengths respectively enter the ones of the plurality of pixels P arranged side by side in the V direction. Each pixel P generates the pixel voltage corresponding to the amount of received light. The drive section 22 (FIG. 3) performs the exposure driving D1 and the read driving D2 on the pixel array 21. By performing the exposure driving D1, the drive section 22 causes each of the plurality of pixels P in the pixel array 21 to perform the exposure operation to accumulate charges corresponding to the amount of received light. At that time, the drive section 22 sets the exposure time Texp on a per-pixel-line-L1 basis. Further, by performing the read driving D2, the drive section 22 causes the plurality of pixels P in the pixel array 21 to perform the read operation to supply the pixel voltages corresponding to the amounts of received light as the signals SIG to the read section 23. The read section 23 generates the image signal Spic on the basis of the signals SIG supplied from the pixel array 21 through the signal lines SIGL. The analysis unit 13 (FIG. 1) performs the analysis process on the basis of the image signal Spic.

Detailed Operation

In the imaging unit 20 of the spectrum analysis apparatus 1, the drive section 22 performs the exposure driving D1 and the read driving D2 on the pixel array 21. By performing the exposure driving D1, the drive section 22 causes each of the plurality of pixels P in the pixel array 21 to perform the exposure operation to accumulate charges corresponding to the amount of received light. By performing the read driving D2, the drive section 22 causes the plurality of pixels P in the pixel array 21 to perform the read operation to supply the pixel voltages corresponding to the amounts of received light to the read section 23. This operation will be described in detail below.

FIG. 5 schematically illustrates an operation of the imaging unit 20 during a frame period F. During a period from timing t1 to timing t7 (the frame period F), the drive section 22 performs the exposure driving D1 and the read driving D2 on the pixel array 21. This operation will be described in detail below.

First, the drive section 22 performs the exposure driving D1 on the pixel array 21 during a period from the timing t1 to timing t6. Specifically, the drive section 22 performs the exposure driving D1 on the pixel array 21 using the plurality of reset control lines OFGL and the plurality of shutter control signals STRX.

The drive section 22 drives the pixels P in the region RA of the pixel array 21 to cause the pixels P in the region RA to perform the exposure operation during a period from the timing t1 to timing t2. The pixels P in the region RA are thereby exposed for the time α. Likewise, the drive section 22 drives the pixels P in the region RB of the pixel array 21 to cause the pixels P in the region RB to perform the exposure operation during a period from the timing t1 to timing t3. The pixels P in the region RB are thereby exposed for the time 2α. The drive section 22 drives the pixels P in the region RC of the pixel array 21 to cause the pixels P in the region RC to perform the exposure operation during a period from the timing t1 to timing t4. The pixels P in the region RC are thereby exposed for the time 4α. The drive section 22 drives the pixels P in the region RD of the pixel array 21 to cause the pixels P in the region RD to perform the exposure operation during a period from the timing t1 to timing t5. The pixels P in the region RD are thereby exposed for the time 8α. The drive section 22 drives the pixels P in the region RE of the pixel array 21 to cause the pixels P in the region RE to perform the exposure operation during a period from the timing t1 to the timing t6. The pixels P in the region RE are thereby exposed for the time 16α.

Next, during a period from the timing t6 to the timing t7, the drive section 22 performs line sequential scanning of the pixel array 21 from the top in the V direction, thereby performing the read driving D2. Specifically, the drive section 22 performs the read driving D2 on the pixel array 21 using the plurality of transfer control signals STRG, the plurality of reset control signals SRST, and the plurality of selection control signals SSEL. The pixels P are thereby sequentially selected on a per-pixel-line-L1 basis, and the selected pixels P supply the pixel voltages corresponding to the amounts of received light as the signals SIG to the read section 23 through the signal lines SIGL.

Specifically, in each pixel P, the transistor TRG is turned on to thereby cause the charges in the capacitive element CAP to be transferred to the floating diffusion FD, and also the transistor SEL is turned on to thereby cause the pixel P to be electrically coupled to the signal line SIGL. As a result, the pixel P outputs the pixel voltage corresponding to the voltage in the floating diffusion FD as the signal SIG to the signal line SIGL. Then, in the pixel P that has outputted the pixel voltage, the transistor RST is turned on to thereby cause a voltage V1 to be applied to the floating diffusion FD. The floating diffusion FD is thereby reset.

The read section 23 generates the image signal Spic on the basis of the signals SIG supplied from the pixel array 21 through the signal lines SIGL. The analysis unit 13 then performs the analysis process on the basis of the image signal Spic.

Regarding Exposure Driving D1

Next, the exposure driving D1 in the imaging unit 20 will be described in detail.

FIGS. 6A, 6B, 6C, 6D, 6E, 6F, 6G, 6H, 6I, and 6J illustrate an example of the exposure driving D1. FIG. 6A illustrates a waveform of the reset control signal SOFG related to the region RA (a reset control signal SOFG_A). FIG. 6B illustrates a waveform of the shutter control signal STRX related to the region RA (a shutter control signal STRX_A). FIG. 6C illustrates a waveform of the reset control signal SOFG related to the region RB (a reset control signal SOFG_B). FIG. 6D illustrates a waveform of the shutter control signal STRX related to the region RB (a shutter control signal STRX_B). FIG. 6E illustrates a waveform of the reset control signal SOFG related to the region RC (a reset control signal SOFG_C). FIG. 6F illustrates a waveform of the shutter control signal STRX related to the region RC (a shutter control signal STRX_C). FIG. 6G illustrates a waveform of the reset control signal SOFG related to the region RD (a reset control signal SOFG_D). FIG. 6H illustrates a waveform of the shutter control signal STRX related to the region RD (a shutter control signal STRX_D). FIG. 6I illustrates a waveform of the reset control signal SOFG related to the region RE (a reset control signal SOFG_E). FIG. 6J illustrates a waveform of the shutter control signal STRX related to the region RE (a shutter control signal STRX_E). In the exposure driving D1, the drive section 22 maintains the plurality of transfer control signals STRG at a low level, the plurality of reset control signals SRST at a low level, and the plurality of selection control signals SSEL at a low level.

The drive section 22 applies the five reset control signals SOFG_A to SOFG_E to the plurality of reset control lines OFGL related to the five regions RA to RE, respectively, and applies the five shutter control signals STRX_A to STRX_E to the plurality of shutter control lines TRXL related to the five regions RA to RE, respectively, thereby performing the exposure driving D1. This causes each of the plurality of pixels P in the pixel array 21 to perform the exposure operation to accumulate charges corresponding to the amount of received light. This operation will be described in detail below.

First, prior to timing t10, the drive section 22 sets the reset control signal SOFG_A to a high level (FIG. 6A). The transistor OFG is thereby turned on in each of the plurality of pixels P in the region RA. As a result, a voltage V1 is applied to the cathode of the light receiving element PD, and the light receiving element PD is thereby reset.

Then, at the timing t10, the drive section 22 changes the reset control signal SOFG_A from the high level to a low level (FIG. 6A). The transistor OFG is thereby turned off in each of the plurality of pixels P in the region RA. This causes each of the plurality of pixels P in the region RA to start the exposure operation.

Likewise, at the timing t10, the drive section 22 changes the reset control signal SOFG_B from a high level to a low level (FIG. 6C), whereby each of the plurality of pixels P in the region RB starts the exposure operation. The drive section 22 changes the reset control signal SOFG_C from a high level to a low level (FIG. 6E), whereby each of the plurality of pixels P in the region RC starts the exposure operation. The drive section 22 changes the reset control signal SOFG_D from a high level to a low level (FIG. 6G), whereby each of the plurality of pixels P in the region RD starts the exposure operation. The drive section 22 changes the reset control signal SOFG_E from a high level to a low level (FIG. 6I), whereby each of the plurality of pixels P in the region RE starts the exposure operation.

Next, at timing t11, the drive section 22 changes the shutter control signal STRX_A from a low level to a high level (FIG. 6B). This causes, in each of the plurality of pixels P in the region RA, the transistor TRX to be turned on and the charges generated by the light receiving element PD to be transferred to the capacitive element CAP through the transistor TRX. As a result, each of the plurality of pixels P in the region RA ends the exposure operation. In this way, the pixels P in the region RA are exposed during a period from the timing t10 to the timing t11. More specifically, the exposure time Texp is set to the time α.

Next, at timing t12, the drive section 22 changes the shutter control signal STRX_A from the high level to the low level (FIG. 6B). The transistor TRX is thereby turned off in each of the plurality of pixels P in the region RA.

Next, at timing t13, the drive section 22 changes the reset control signal SOFG_A from the low level to the high level (FIG. 6A). The transistor OFG is thereby turned on in each of the plurality of pixels P in the region RB. As a result, a voltage V1 is applied to the cathode of the light receiving element PD, and the light receiving element PD is thereby reset. The light receiving element PD in this pixel P thereby no longer generates or accumulates charges, which makes it possible to prevent leakage of charges from this pixel P to pixels P therearound.

Likewise, at timing t21, the drive section 22 changes the shutter control signal STRX_B from a low level to a high level (FIG. 6D), whereby each of the plurality of pixels P in the region RB ends the exposure operation. In this way, the pixels P in the region RB are exposed during a period from the timing t10 to the timing t21. More specifically, the exposure time Texp is set to the time $2\alpha$. Then, at timing t22, the drive section 22 changes the shutter control signal STRX_B from the high level to the low level (FIG. 6D), and at timing t23, changes the reset control signal SOFG_B from the low level to the high level (FIG. 6C).

Likewise, at timing t31, the drive section 22 changes the shutter control signal STRX_C from a low level to a high level (FIG. 6F), whereby each of the plurality of pixels P in the region RC ends the exposure operation. In this way, the pixels P in the region RC are exposed during a period from the timing t10 to the timing t31. More specifically, the exposure time Texp is set to the time $4\alpha$. Then, at timing t32, the drive section 22 changes the shutter control signal STRX_C from the high level to the low level (FIG. 6F), and at timing t33, changes the reset control signal SOFG_C from the low level to the high level (FIG. 6E).

Likewise, at timing t41, the drive section 22 changes the shutter control signal STRX_D from a low level to a high level (FIG. 6H), whereby each of the plurality of pixels P in the region RD ends the exposure operation. In this way, the pixels P in the region RD are exposed during a period from the timing t10 to the timing t41. More specifically, the exposure time Texp is set to the time $8\alpha$. Then, at timing t42, the drive section 22 changes the shutter control signal STRX_D from the high level to the low level (FIG. 6H), and at timing t43, changes the reset control signal SOFG_D from the low level to the high level (FIG. 6G).

Likewise, at timing t51, the drive section 22 changes the shutter control signal STRX_E from a low level to a high level (FIG. 6J), whereby each of the plurality of pixels P in the region RE ends the exposure operation. In this way, the pixels P in the region RE are exposed during a period from the timing t10 to the timing t51. More specifically, the exposure time Texp is set to the time $16\alpha$. Then, at timing t52, the drive section 22 changes the shutter control signal STRX_E from the high level to the low level (FIG. 6J), and at timing t53, changes the reset control signal SOFG_E from the low level to the high level (FIG. 6I).

In this way, in the imaging unit 20, the exposure times Texp for the pixels P included in the regions RA, RB, RC, RD, and RE are set to the times $\alpha$, $2\alpha$, $4\alpha$, $8\alpha$, and $16\alpha$, respectively.

As described above, in the spectrum analysis apparatus 1, the light receiving sensitivities of the pixels P included in a plurality of regions R (in this example, the five regions RA to RE) are caused to be different from one region R to another. Specifically, in this example, the exposure times Texp in the plurality of regions R are caused to be different from one region R to another. This makes it possible for the spectrum analysis apparatus 1 to achieve a wide dynamic range. More specifically, for example, in a case where a spectrum analysis apparatus is configured with a so-called line sensor in which a plurality of pixels P is arranged side by side in the H direction instead of the imaging unit 20, there is a limitation to a dynamic range obtainable in one operation, which can result in a narrower dynamic range. In contrast, in the spectrum analysis apparatus 1 according to the present embodiment, because the exposure times Texp in the plurality of regions R are different from one region R to another, it is possible to obtain five spectra S with different exposure times Texp at one operation. For example, in a case of analyzing a weak light component of continuous spectrum light in detail, data obtained with a long exposure time Texp is usable, whereas in a case of analyzing an intense light component of the continuous spectrum light in detail, data obtained with a short exposure time Texp is usable. It is thereby possible for the spectrum analysis apparatus 1 to achieve a wide dynamic range. In particular, in the spectrum analysis apparatus 1, the exposure time Texp for the pixels P in each of the plurality of regions R is set to a time proportional to a power of 2. This makes it possible to effectively extend the dynamic range. As a result, it is possible for the spectrum analysis apparatus 1 to increase the accuracy of spectrum analysis.

Such a wide dynamic range is useful in some applications. For example, the spectrum analysis apparatus 1 is usable in sorting fruit. Fruit is often sorted on the basis of the sugar content of the fruit or on the basis of freshness of the fruit. Sugar absorbs light of a wavelength of, for example, 900 nm, and water absorbs light of a wavelength of, for example, 1450 nm. It is therefore desired that the spectrum analysis apparatus 1 detect, for example, light components in these two wavelength regions in the continuous spectrum light with high accuracy. Because the intensities of light in these two wavelength regions are different from each other in general, an exposure time Texp that allows for accurate detection of light of a wavelength of 900 nm and an exposure time Texp that allows for accurate detection of light of a wavelength of 1450 nm are different from each other. According to the spectrum analysis apparatus 1, because the exposure times Texp in the plurality of regions R are caused to be different from one region R to another, it is possible to detect the light of a wavelength of 900 nm and the light of a wavelength of 1450 nm with high accuracy. This makes it possible to increase the accuracy of sorting.

Further, in the spectrum analysis apparatus 1, each of the plurality of regions R (the five regions RA to RE in this example) includes a plurality of pixel lines L1. Then, the analysis unit 13 generates the spectrum SA by performing, for example, the averaging process on the basis of a plurality of spectra that respectively correspond to the plurality of pixel lines L1 included in the region RA, for example. The same applies to the spectra SB to SE. As a result, it is possible for the spectrum analysis apparatus 1 to reduce noise in the spectra SA to SE, which consequently makes it possible to increase the accuracy of spectrum analysis. More specifically, for example, in the case where a spectrum analysis apparatus is configured with a line sensor instead of the imaging unit 20, a method is conceivable in which a plurality of spectra is generated with a plurality of operations and an averaging process, for example, is performed on the basis of the plurality of spectra. In such a case, however, the plurality of operations is time-consuming and can thus result in, for example, noise occurring due to various external factors related to time, including time-related changes in intensity of light outputted by the light source 11. In contrast, in the spectrum analysis apparatus 1 according to the present embodiment, because each of the plurality of regions R includes the plurality of pixel lines L1, it is possible to generate a plurality of spectra that respectively correspond to the plurality of pixel lines L1 included in, for example, the region RA by one operation, and it is possible to perform, for example, the averaging process on the basis of those plurality of spectra. Thus, according to the spectrum analysis apparatus 1, because of a short operation time, it is possible to suppress noise related to time, which makes it possible to reduce noise in the spectra SA to SE. As a result, it is possible to increase the accuracy of spectrum analysis.

Further, in the spectrum analysis apparatus 1, the light receiving sensitivities of the pixels P included in a plurality of regions R (the five regions RA to RE in this example) are set by setting the exposure times Texp for the pixels P in these regions. Further, in the spectrum analysis apparatus 1, the time α is changeable and the number of the regions R is also changeable. It is thus possible for the spectrum analysis apparatus 1 to change the settings of the light receiving sensitivities of the pixels P by changing the driving method. This makes it possible to increase the degree of freedom of spectrum analysis. As a result, it is possible to perform spectrum analysis on various measurement target objects OBJ by setting more desirable conditions, for example.

Effects

As described above, according to the present embodiment, it is possible to achieve a wide dynamic range because the light receiving sensitivities of the pixels included in a plurality of regions are caused to be different from one region to another. This makes it possible to increase the accuracy of spectrum analysis.

According to the present embodiment, because each of the plurality of regions includes a plurality of pixel lines, it is possible to reduce noise in a spectrum. This makes it possible to increase the accuracy of spectrum analysis.

According to the present embodiment, the light receiving sensitivities of the pixels included in a plurality of regions are set by setting the exposure times for the pixels in these regions. This makes it possible to increase the degree of freedom of spectrum analysis.

Modification Example 1-1

In the foregoing embodiment, line sequential scanning is performed on the pixel array 21 from the top in the V direction to thereby perform the read driving D2; however, this is non-limiting. Instead of this, for example, line sequential scanning may be performed on only one of the five regions RA to RE to thereby perform the read driving D2. This makes it possible to effectively obtain data for a certain exposure time Texp only.

Modification Example 1-2

In the foregoing embodiment, as illustrated in FIG. 6, the drive section 22 applies the five reset control signals SOFG_A to SOFG_E to the plurality of reset control lines OFGL related to the five regions RA to RE, respectively; however, this is non-limiting. For example, in a case where leakage of charges from a pixel P to pixels P therearound is small, the same reset control signal SOFG may be applied to all the reset control lines OFGL in the pixel array 21. An imaging unit 20B according to the present modification example will be described in detail below. The imaging unit 20B includes a drive section 22B.

FIGS. 7A, 7B, 7C, 7D, 7E, and 7F illustrate an example of the exposure driving D1 of the drive section 22B. FIG. 7A illustrates a waveform of the reset control signal SOFG applied to all the reset control lines OFGL in the pixel array 21. FIG. 7B illustrates a waveform of the shutter control signal STRX related to the region RA (the shutter control signal STRX_A). FIG. 7C illustrates a waveform of the shutter control signal STRX related to the region RB (the shutter control signal STRX_B). FIG. 7D illustrates a waveform of the shutter control signal STRX related to the region RC (the shutter control signal STRX_C). FIG. 7E illustrates a waveform of the shutter control signal STRX related to the region RD (the shutter control signal STRX_D). FIG. 7F illustrates a waveform of the shutter control signal STRX related to the region RE (the shutter control signal STRX_E).

In this example, first, prior to the timing t10, the drive section 22B sets the reset control signal SOFG to a high level (FIG. 7A). The transistor OFG is thereby turned on in each of the plurality of pixels P in the pixel array 21. As a result, a voltage V1 is applied to the cathode of the light receiving element PD, and the light receiving element PD is thereby reset.

Then, at the timing t10, the drive section 22B changes the reset control signal SOFG from the high level to a low level (FIG. 7A). The transistor OFG is thereby turned off in each of the plurality of pixels P in the pixel array 21. This causes each of the plurality of pixels P in the pixel array 21 to start the exposure operation.

Next, at the timing t11, the drive section 22B changes the shutter control signal STRX_A from a low level to a high level (FIG. 7B). This causes, in each of the plurality of pixels P in the region RA, the transistor TRX to be turned on and the charges generated by the light receiving element PD to be transferred to the capacitive element CAP through the transistor TRX. As a result, each of the plurality of pixels P in the region RA ends the exposure operation.

Next, at the timing t12, the drive section 22B changes the shutter control signal STRX_A from the high level to the low level (FIG. 7B). The transistor TRX is thereby turned off in each of the plurality of pixels P in the region RA.

Likewise, at the timing t21, the drive section 22B changes the shutter control signal STRX_B from a low level to a high level (FIG. 7C), whereby each of the plurality of pixels P in the region RB ends the exposure operation. Then, at the timing t22, the drive section 22B changes the shutter control signal STRX_B from the high level to the low level.

Likewise, at the timing t31, the drive section 22B changes the shutter control signal STRX_C from a low level to a high level (FIG. 7D), whereby each of the plurality of pixels P in the region RC ends the exposure operation. Then, at the timing t32, the drive section 22B changes the shutter control signal STRX_C from the high level to the low level.

Likewise, at the timing t41, the drive section 22B changes the shutter control signal STRX_D from a low level to a high level (FIG. 7E), whereby each of the plurality of pixels P in the region RD ends the exposure operation. Then, at the timing t42, the drive section 22B changes the shutter control signal STRX_D from the high level to the low level.

Likewise, at the timing t51, the drive section 22B changes the shutter control signal STRX_E from a low level to a high level (FIG. 7F), whereby each of the plurality of pixels P in the region RE ends the exposure operation. Then, at the timing t52, the drive section 22B changes the shutter control signal STRX_E from the high level to the low level.

Then, at timing t19, the drive section 22B changes the reset control signal SOFG from the low level to the high level (FIG. 7A). The transistor OFG is thereby turned on in each of the plurality of pixels P in the pixel array 21. As a result, a voltage V1 is applied to the cathode of the light receiving element PD, and the light receiving element PD is thereby reset.

In this way, in the imaging unit 20B according to the present modification example, the same reset control signal SOFG is applied to all the reset control lines OFGL in the pixel array 21. This makes it possible to provide a simpler driving method as compared with the case of the foregoing embodiment (FIGS. 6A, 6B, 6C, 6D, 6E, 6F, 6G, 6H, 6I, and 6J).

Modification Example 1-3

In the foregoing embodiment, the spectrum analysis apparatus 1 is configured with the imaging unit 20 that performs the imaging operation by the global shutter method; however, this is non-limiting. Instead of this, for example, a spectrum analysis apparatus may be configured with an imaging unit that performs an imaging operation by a rolling shutter method. FIG. 8 illustrates a configuration example of an imaging unit 20C according to the present modification example. The imaging unit 20C includes a pixel array 21C, a drive section 22C, and the read section 23. The pixel array 21C includes the plurality of reset control lines OFGL, the plurality of shutter control lines TRXL, the plurality of reset control lines RSTL, the plurality of selection control lines SELL, the plurality of signal lines SIGL, and a plurality of pixels PC. Each pixel PC includes the light receiving element PD, the transistor OFG, the transistor TRG, the floating diffusion FD, and the transistors RST, AMP, and SEL. The drain of the transistor TRX is coupled to the floating diffusion FD, the source of the transistor RST, and the gate of the transistor AMP. The pixel array 21C corresponds to the pixel array 21 (FIG. 3) according to the foregoing embodiment from which the plurality of transfer control lines TRGL are omitted and in which the capacitive element CAP and the transistor TRG are omitted from each of the pixels P. The drive section 22C drives the pixels PC in the pixel array 21C.

Modification Example 1-4

In the foregoing embodiment, the five regions R are set in the pixel array 21. The respective numbers of the pixel lines L1 in these five regions R may be equal to each other or different from one region to another R. For example, increasing the number of the pixel lines L1 in the region RA makes it possible to increase the accuracy of the spectrum SA generated on the basis of the pixel values VAL in the region RA.

Modification Example 1-5

In the foregoing embodiment, the five regions R are provided in the pixel array 21; however, this is non-limiting. Two to four regions R may be provided, or six or more regions R may be provided. Further, for example, as illustrated in FIG. 9, a plurality of regions R with equal exposure times Texp may be provided. In this example, the pixel array 21 is divided into six regions R (regions RA1, RB1, RC1, RA2, RB2, and RC2) arranged side by side in the V direction. The regions RA1, RB1, RC1, RA2, RB2, and RC2 are arranged in this order from the top in FIG. 9. In this example, the drive section 22 sets the exposure times Texp for the pixels P included in the regions RA1 and RA2 to the time $\alpha(=2^0 \times \alpha)$, sets the exposure times Texp for the pixels P included in the regions RB1 and RB2 to the time $2\alpha(=2^1 \times \alpha)$, and sets the exposure times Texp for the pixels P included the regions RC1 and RC2 to the time $4\alpha(=2^2 \times \alpha)$. On the basis of the pixel values VAL obtained from each of the plurality of pixel lines L1 included in the regions RA1 and RA2, for example, the analysis unit 13 generates a spectrum corresponding to the pixel line L1. Then, the analysis unit 13 is able to generate the spectrum SA by performing, for example, the averaging process on the basis of a plurality of spectra that respectively correspond to the plurality of pixel lines L1 included in the regions RA1 and RA2. The same applies to the regions RB1 and RB2, and also to the regions RC1 and RC2.

Other Modification Examples

Further, two or more of these modification examples may be combined.

2. Second Embodiment

Next, a spectrum analysis apparatus 2 according to a second embodiment will be described. In the present embodiment, an orientation of the continuous spectrum light entering the imaging unit differs from that in the case of the first embodiment. It is to be noted that the components substantially the same as those of the spectrum analysis apparatus 1 according to the first embodiment are denoted by the same reference numerals, and descriptions thereof are omitted as appropriate.

FIG. 10 illustrates a configuration example of the spectrum analysis apparatus 2. The spectrum analysis apparatus 2 includes an imaging unit 30.

FIG. 11A schematically illustrates a configuration example of the imaging unit 30. FIG. 11B illustrates an example of the pixel values VAL obtained in the imaging unit 30. The imaging unit 30 includes a pixel array 31. The pixel array 31 includes a plurality of pixels P arranged in a matrix. FIG. 11B illustrates the pixel values VAL obtained by a single column of pixels P illustrated in FIG. 11A.

In FIG. 11A, the horizontal direction is the H direction, and the vertical direction is the V direction. As illustrated in FIG. 10, pieces of light having different wavelengths included in the continuous spectrum light outputted by the prism 12 respectively enter ones of the plurality of pixels P arranged side by side in the V direction. Further, pieces of light having equal wavelengths respectively enter ones of the plurality of pixels P arranged side by side in the H direction. This makes it possible for the imaging unit 30 to obtain a spectrum corresponding to the measurement target object OBJ as illustrated in FIG. 11B on the basis of results of detection by the ones of the plurality of pixels P arranged side by side in the V direction.

FIG. 12 illustrates a configuration example of the imaging unit 30. The imaging unit 30 includes a drive section 32, a read drive section 33, and the read section 23, in addition to the pixel array 31.

The pixel array 31 includes the plurality of reset control lines OFGL, the plurality of shutter control lines TRXL, the plurality of transfer control lines TRGL, the plurality of reset control lines RSTL, the plurality of selection control lines SELL, and the plurality of signal lines SIGL. Each of the plurality of reset control lines OFGL extends in the vertical direction in FIG. 12, and has one end coupled to the drive section 32. The reset control signals SOFG are applied to the reset control lines OFGL by the drive section 32. Each of the plurality of shutter control lines TRXL extends in the vertical direction in FIG. 12, and has one end coupled to the drive section 32. The shutter control signals STRX are applied to the shutter control lines TRXL by the drive section 32. Each of the plurality of transfer control lines TRGL extends in the horizontal direction in FIG. 12, and has one end coupled to the read drive section 33. The transfer control signals STRG are applied to the transfer control lines TRGL by the read drive section 33. Each of the plurality of reset control lines RSTL extends in the horizontal direction in FIG. 12, and has one end coupled to the read drive section 33. The reset control signals SRST are applied to the reset control lines RSTL by the read drive section 33. Each of the plurality of selection control lines SELL extends in the horizontal direction in FIG. 12, and has one end coupled to the read drive section 33. The selection control signals SSEL are applied to the plurality of selection control lines SELL by the read drive section 33. In FIGS. 11A, 11B, and 12, a single column of pixels P arranged side by side in the vertical direction (the V direction) constitutes a pixel line L2.

In the pixel P, the gate of the transistor OFG is coupled to the reset control line OFGL, the gate of the transistor TRX is coupled to the shutter control line TRXL, the gate of the transistor TRG is coupled to the transfer control line TRGL, the gate of the transistor RST is coupled to the reset control line RSTL, and the gate of the transistor SEL is coupled to the selection control line SELL.

The drive section 32 performs the exposure driving D1 on the pixel array 31. Specifically, the drive section 32 applies the plurality of reset control signals SOFG respectively to the plurality of reset control lines OFGL in the pixel array 31, and applies the plurality of shutter control signals STRX respectively to the plurality of shutter control lines TRXL, thereby driving the pixel array 31 on a per-pixel-line-L2 basis. The drive section 32 is able to set the exposure time Texp on a per-pixel-line-L2 basis.

FIG. 13 illustrates an example of setting of the exposure time Texp. In this example, the pixel array 31 is divided into five regions R (regions RA to RE) arranged side by side in the H direction. The region RA, the region RB, the region RC, the region RD, and the region RE are arranged in this order from the left in FIG. 13. The pixel array 31 includes a plurality of pixel lines L2 in each of the plurality of regions R. In this example, the drive section 32 sets the exposure times Texp for the pixels P included in the regions RA, RB, RC, RD, and RE to times $\alpha$, $2\alpha$, $4\alpha$, $8\alpha$, and $16\alpha$, respectively.

Specifically, as in the case of the drive section 22 according to the first embodiment (FIGS. 7A, 7B, 7C, 7D, 7E, and 7F), the drive section 32 applies the five reset control signals SOFG_A to SOFG_E to the plurality of reset control lines OFGL related to the five regions RA to RE, respectively, and applies the five shutter control signals STRX_A to STRX_E to the plurality of shutter control lines TRXL related to the five regions RA to RE, respectively. As a result, in the imaging unit 30, the exposure times Texp for the pixels P included in the five regions RA, RB, RC, RD, and RE are set to the times $\alpha$, $2\alpha$, $4\alpha$, $8\alpha$, and $16\alpha$, respectively.

The read drive section 33 performs the read driving D2 on the pixel array 31. Specifically, the read drive section 33 applies the plurality of transfer control signals STRG respectively to the plurality of transfer control lines TRGL in the pixel array 31, applies the plurality of reset control signals SRST respectively to the plurality of reset control lines RSTL, and applies the plurality of selection control signals SSEL respectively to the plurality of selection control lines SELL, thereby driving the pixel array 31 row by row of pixels P in the pixel array 31.

The pixels P in a row selected by the read drive section 33 are arranged side by side in the H direction. Thus, pieces of light having equal wavelengths respectively enter the pixels P in the row. Data obtained by the pixels P in the row is therefore data concerning the pieces of light having equal wavelengths, and includes data obtained with a plurality of exposure times Texp. The read drive section 33 sequentially selects the plurality of pixels P in the pixel array 31 row by row of pixels P. As a result, the pixels P in the selected row output the pixel voltages as the signals SIG to the signal line SIGL. Then, the read section 23 generates the image signal Spic on the basis of the signals SIG supplied from the pixel array 31 through the signal lines SIGL.

Then, on the basis of the pixel values VAL obtained from each of the plurality of pixel lines L2 included in the region RA, the analysis unit 13 generates a spectrum corresponding to the pixel line L2. Then, the analysis unit 13 generates the spectrum SA by performing, for example, the averaging process on the basis of a plurality of spectra that respectively correspond to the plurality of pixel lines L2 included in the region RA. The same applies to the spectra SB to SE. Then, the analysis unit 13 performs the predetermined analysis process on the basis of the five spectra SA to SE.

Here, the V direction corresponds to a specific example of the "first direction" in the present disclosure. The H direction corresponds to a specific example of the "second direction" in the present disclosure. The drive section 32 and the read drive section 33 correspond to a specific example of the "drive section" in the present disclosure.

As described above, in the spectrum analysis apparatus 2, pieces of light having different wavelengths included in the continuous spectrum light outputted by the prism 12 respectively enter the ones of the plurality of pixels P arranged side by side in the V direction, and pieces of light having equal wavelengths respectively enter the ones of the plurality of pixels P arranged side by side in the H direction. Even with such a configuration, it is possible to increase the accuracy of spectrum analysis as with the spectrum analysis apparatus 1 according to the first embodiment.

Modification Example 2-1

In the foregoing embodiment, line sequential scanning is performed on the pixel array 31 in order from the top in the V direction to thereby perform the read driving D2; however, this is non-limiting. Instead of this, the read driving D2 may be performed on only some of the rows in the pixel array 31, for example. It is thereby possible to effectively obtain data for a certain wavelength region only in the continuous spectrum light.

Modification Example 2-2

Each of the modification examples of the foregoing first embodiment may be applied to the spectrum analysis apparatus 2 according to the above-described embodiment.

3. Third Embodiment

Next, a spectrum analysis apparatus 3 according to a third embodiment will be described. In the present embodiment, a light-transmissive film is provided on a light entrance surface of the imaging unit, and a transmittance of this light-transmissive film is used to cause the light receiving sensitivities of the pixels P included in a plurality of regions R to be different from one region R to another. It is to be noted that the components substantially the same as those of the spectrum analysis apparatus 1 according to the foregoing first embodiment are denoted by the same reference numerals, and descriptions thereof are omitted as appropriate.

As illustrated in FIG. 1, the spectrum analysis apparatus 3 includes an imaging unit 40. As illustrated in FIGS. 2A and 2B, the imaging unit 40 includes the pixel array 21. As illustrated in FIGS. 1, 2A, and 2B, pieces of light having different wavelengths in the continuous spectrum light outputted by the prism 12 respectively enter the ones of the plurality of pixels P arranged side by side in the H direction. Further, pieces of light having equal wavelengths respectively enter the ones of the plurality of pixels P arranged side by side in the V direction.

FIG. 14 illustrates a configuration example of the imaging unit 40. The light-transmissive film 49 is formed on the light entrance surface of the imaging unit 40. In this example, the light-transmissive film 49 is divided into five regions R (the regions RA to RE) arranged side by side in the V direction. As is the case with the first embodiment (FIGS. 2A and 2B), the pixel array 21 includes the plurality of pixel lines L1 in a region corresponding to each of these plurality of regions R.

In this example, a transmittance of the light-transmissive film 49 in the region RE is set to a predetermined value β. Further, a transmittance of the light-transmissive film 49 in the region RD is set to a value β/2, a transmittance of the light-transmissive film 49 in the region RC is set to a value β/4, a transmittance of the light-transmissive film 49 in the region RB is set to a value β/8, and a transmittance of the light-transmissive film 49 in the region RA is set to a value β/16. As a result, the light receiving sensitivity of the pixels P included in each of the regions RA to RE is proportional to a power of 2. More specifically, the light receiving sensitivity of the pixels P included in the region RA is the lowest, and the light receiving sensitivity of the pixels P included in the region RE is the highest. The spectrum analysis apparatus 3 is thereby able to achieve a wide dynamic range, as with the spectrum analysis apparatus 1 according to the first embodiment.

As illustrated in FIG. 3, the imaging unit 40 includes a drive section 42 and the read section 23, in addition to the pixel array 21.

As with the drive section 22 according to the foregoing first embodiment, the drive section 42 applies the plurality of reset control signals SOFG respectively to the plurality of reset control lines OFGL in the pixel array 21, applies the plurality of shutter control signals STRX respectively to the plurality of shutter control lines TRXL, applies the plurality of transfer control signals STRG respectively to the plurality of transfer control lines TRGL, applies the plurality of reset control signals SRST respectively to the plurality of reset control lines RSTL, and applies the plurality of selection control signals SSEL respectively to the plurality of selection control lines SELL, thereby driving the pixel array 21 on a per-pixel-line-L1 basis. The drive section 42 performs the exposure driving D1 and the read driving D2 on the pixel array 21.

By performing the exposure driving D1, the drive section 42 causes each of the plurality of pixels P in the pixel array 21 to perform the exposure operation to accumulate charges corresponding to the amount of received light. In the exposure driving D1, the drive section 42 sets the exposure times Texp for all the pixel lines L1 to the same time. More specifically, although the drive section 22 according to the first embodiment is able to set the exposure time Texp on a per-pixel-line-L1 basis, the drive section 42 according to the present embodiment sets the exposure times Texp for all the pixel lines L1 to the same time.

Here, the light-transmissive film 49 corresponds to a specific example of a "light-transmissive film" in the present disclosure. The H direction corresponds to a specific example of the "first direction" in the present disclosure. The V direction corresponds to a specific example of the "second direction" in the present disclosure. The drive section 42 corresponds to a specific example of the "drive section" in the present disclosure.

FIG. 15 schematically illustrates an operation of the imaging unit 40 during the frame period F. The drive section 42 performs the exposure driving D1 and the read driving D2 on the pixel array 21 during a period from timing t61 to timing t63 (the frame period F).

First, the drive section 42 performs the exposure driving D1 on the pixel array 21 during a period from the timing t61 to timing t62.

FIGS. 16A and 16B illustrates an example of the exposure driving D1. FIG. 16A illustrates a waveform of the reset control signal SOFG. FIG. 16B illustrates a waveform of the shutter control signal STRX. The drive section 42 performs the exposure driving D1 by applying the reset control signal SOFG to each of the plurality of reset control lines OFGL in the pixel array 21 and applying the shutter control signal STRX to each of the plurality of shutter control lines TRXL in the pixel array 21.

First, prior to timing t71, the drive section 42 sets the reset control signal SOFG to a high level (FIG. 16A). The transistor OFG is thereby turned on in each of the plurality of pixels P in the pixel array 21. As a result, a voltage V1 is applied to the cathode of the light receiving element PD, and the light receiving element PD is thereby reset.

Then, at the timing t71, the drive section 42 changes the reset control signal SOFG from the high level to a low level (FIG. 16A). The transistor OFG is thereby turned off in each of the plurality of pixels P in the pixel array 21. This causes each of the plurality of pixels P to start the exposure operation.

Next, at timing t72, the drive section 42 changes the shutter control signal STRX from a low level to a high level (FIG. 16B). This causes, in each of the plurality of pixels P in the pixel array 21, the transistor TRX to be turned on and the charges generated by the light receiving element PD to be transferred to the capacitive element CAP through the transistor TRX. As a result, each of the plurality of pixels P ends the exposure operation. In this way, all the pixels P in the pixel array 21 are exposed during a period from the timing t71 to the timing t72. More specifically, the exposure time Texp is set to the time α.

Next, at timing t73, the drive section 42 changes the shutter control signal STRX from the high level to the low level (FIG. 16B). The transistor TRX is thereby turned off in each of the plurality of pixels P in the pixel array 21.

Next, at timing t74, the drive section 42 changes the reset control signal SOFG_A from the low level to the high level (FIG. 6A). The transistor OFG is thereby turned on in each of the plurality of pixels P in the pixel array 21. As a result, a voltage V1 is applied to the cathode of the light receiving element PD, and the light receiving element PD is thereby reset.

In this way, in the imaging unit 40, the exposure times Texp for all the pixels P in the pixel array 21 are set to the time α.

Then, as illustrated in FIG. 15, during a period from the timing t62 to the timing t63, the drive section 42 performs line sequential scanning of the pixel array 21 in order from the top in the V direction to thereby perform the read driving D2, as is the case of the foregoing first embodiment.

As described above, in the spectrum analysis apparatus 3, the light receiving sensitivities of the pixels P included in a plurality of regions R (the five regions RA to RE in this example) are set by setting the transmittances of the light-transmissive film 49 in these regions R. This makes it possible for the spectrum analysis apparatus 3 to set the exposure times Texp for all the pixels P in the pixel array 21 to the same time, thus making it possible to simplify the driving method.

As described above, according to the present embodiment, it is possible to simplify the driving method because the light receiving sensitivities of the pixels included in the plurality of regions R are set by setting the transmittances of the light-transmissive film in these regions. Other effects are similar to those of the foregoing first embodiment.

Modification Example 3-1

In the foregoing embodiment, the light receiving sensitivities are set by using the transmittances of the light-transmissive film 49 instead of the exposure times Texp in the spectrum analysis apparatus 1 according to the first embodiment. Similarly, for example, in the spectrum analysis apparatus 2 according to the second embodiment, the light receiving sensitivities may be set by using the transmittances of a light-transmissive film instead of the exposure times Texp. A spectrum analysis apparatus 4 according to the present modification example will be described in detail below.

As illustrated in FIG. 10, the spectrum analysis apparatus 4 includes an imaging unit 50. The imaging unit 50 includes the pixel array 31, as illustrated in FIGS. 11A and 11B. As illustrated in FIGS. 10, 11A and 11B, pieces of light having different wavelengths in the continuous spectrum light outputted by the prism 12 respectively enter the ones of the plurality of pixels P arranged side by side in the V direction. Pieces of light having equal wavelengths respectively enter the ones of the plurality of pixels P arranged side by side in the H direction.

FIG. 17 illustrates a configuration example of the imaging unit 50. A light-transmissive film 59 is formed on a light entrance surface of the imaging unit 50. In this example, the light-transmissive film 59 is divided into five regions R (the regions RA to RE) arranged side by side in the H direction. As is the case with the second embodiment (FIGS. 11A and 11B), the pixel array 31 includes the plurality of pixel lines L2 in a region corresponding to each of these plurality of regions R. In this example, a transmittance of the light-transmissive film 59 in the region RE is set to the predetermined value β, a transmittance of the light-transmissive film 59 in the region RD is set to the value β/2, a transmittance of the light-transmissive film 59 in the region RC is set to the value β/4, a transmittance of the light-transmissive film 59 in the region RB is set to the value β/8, and a transmittance of the light-transmissive film 59 in the region RA is set to the value β/16.

As illustrated in FIG. 12, the imaging unit 50 includes a drive section 52, the read drive section 33, and the read section 23, in addition to the pixel array 31.

The drive section 52 performs the exposure driving D1 on the pixel array 31. Specifically, as with the drive section 32 according to the foregoing second embodiment, the drive section 52 applies the plurality of reset control signals SOFG respectively to the plurality of reset control lines OFGL in the pixel array 31, and applies the plurality of shutter control signals STRX respectively to the plurality of shutter control lines TRXL, thereby driving the pixel array 31 on a per-pixel-line-L2 basis. In the exposure driving D1, the drive section 52 sets the exposure times Texp for all the pixel lines L2 to the same time.

Here, the light-transmissive film 59 corresponds to a specific example of the "light-transmissive film" in the present disclosure. The V direction corresponds to a specific example of the "first direction" in the present disclosure. The H direction corresponds to a specific example of the "second direction" in the present disclosure. The drive section 52 and the read drive section 33 correspond to a specific example of the "drive section" in the present disclosure.

Modification Example 3-2

Each of the modification examples of the foregoing first embodiment may be applied to the spectrum analysis apparatus 3 according to the above-described embodiment.

Although the present technology has been described above with reference to some embodiments and modification examples, the present technology is not limited to these embodiments, etc., and various modifications may be made.

In the foregoing embodiments, each AD converter 24 is coupled to a single column of pixels P in the pixel array; however, this is non-limiting. Instead of this, for example, an AD converter may be coupled to a plurality of pixels P included in a predetermined area, as in a pixel array 61 of an imaging unit 60 illustrated in FIGS. 18 and 19. The pixel array 61 is divided into a plurality of (in this example, 12) areas AR. The pixel array 61 includes a plurality of pixels P in each of the plurality of areas AR. Further, in the imaging unit 60, a plurality of drive sections 62 is provided in correspondence with the plurality of areas AR, and a plurality of AD converters 63 is provided in correspondence with the plurality of areas AR. As illustrated in FIG. 19, in each of the plurality of areas AR, the plurality of pixels P is driven by the drive section 62 corresponding to the area AR, and each supplies a pixel voltage corresponding to the amount of received light to the AD converter 63 corresponding to the area AR. For example, in a case where the technique of the first embodiment is applied to the present modification example, as illustrated in FIG. 20, it is possible for the plurality of drive sections 62 to set the exposure time Texp for a plurality of pixels P included in a first row of areas AR to the time α, the exposure time Texp for a plurality of pixels P included in a second row of areas AR to the time 2α, and the exposure time Texp for a plurality of pixels P included in a third row of areas AR to the time 4α. Here, each area AR corresponds to a specific example of a "region" in the present disclosure.

In the foregoing embodiments, as illustrated in FIG. 1, light transmitted through the measurement target object OBJ enters the prism 12; however, this is non-limiting. Instead of this, for example, as in a spectrum analysis apparatus 5 illustrated in FIG. 21, light reflected by the measurement target object OBJ may enter the prism 12.

In the foregoing embodiments, the light receiving sensitivity in each of the plurality of regions R is set to a value proportional to a power of 2; however, this is non-limiting. The light receiving sensitivity may differ from a value proportional to a power of 2.

For example, the number of the regions R, the shape of the regions R, and the configuration of the pixel P in each of the foregoing embodiments, etc. are examples and may be modified as appropriate.

It should be appreciated that the effects described herein are merely exemplary and non-limiting. In addition, other effects may be achieved.

It is to be noted that the present technology may be configured as follows.

(1)

An imaging device including:

a plurality of pixels arranged side by side in a first direction and a second direction and each including a light receiving element; and a drive section configured to drive the plurality of pixels, in which of the plurality of pixels, ones arranged side by side in the first direction have respective light receiving sensitivities equal to each other, and of the plurality of pixels, ones arranged side by side in the second direction include a first pixel and a second pixel each having a light receiving sensitivity, the light receiving sensitivity of the first pixel and the light receiving sensitivity of the second pixel being different from each other.

(2)

The imaging device according to (1), in which the ones of the plurality of pixels arranged side by side in the second direction include three or more pixels that have respective light receiving sensitivities different from each other.

(3)

The imaging device according to (2), in which the respective light receiving sensitivities of the three or more pixels are each proportional to a power of 2.

(4)

The imaging device according to any one of (1) to (3), in which the ones of the plurality of pixels arranged side by side in the second direction include:

a third pixel having a light receiving sensitivity equal to the light receiving sensitivity of the first pixel and being adjacent to the first pixel in the second direction; and a fourth pixel having a light receiving sensitivity equal to the light receiving sensitivity of the second pixel and being adjacent to the second pixel in the second direction.

(5)

The imaging device according to any one of (1) to (4), in which the ones of the plurality of pixels arranged side by side in the first direction are configured to detect pieces of light having wavelengths different from each other, and the ones of the plurality of pixels arranged side by side in the second direction are configured to detect pieces of light having wavelengths equal to each other.

(6)

The imaging device according to any one of (1) to (5), in which the drive section is configured to drive the first pixel and the second pixel to cause a first exposure time for the first pixel and a second exposure time for the second pixel to be different from each other, the light receiving sensitivity of the first pixel is a light receiving sensitivity corresponding to the first exposure time, and the light receiving sensitivity of the second pixel is a light receiving sensitivity corresponding to the second exposure time.

(7)

The imaging device according to any one of (1) to (5), further including a light-transmissive film, in which the light receiving element of each of the plurality of pixels is formed on a semiconductor substrate, the light-transmissive film is formed on a light entrance surface of the semiconductor substrate, the light-transmissive film has a first light-transmission degree in a region corresponding to the first pixel and a second light-transmission degree in a region corresponding to the second pixel, the first light-transmission degree and the second light-transmission degree being different from each other, the light receiving sensitivity of the first pixel is a light receiving sensitivity corresponding to the first light-transmission degree, and the light receiving sensitivity of the second pixel is a light receiving sensitivity corresponding to the second light-transmission degree.

(8)

The imaging device according to any one of (1) to (7), in which the plurality of pixels is configured to perform an exposure operation on a basis of a first control signal, and the drive section is configured to set an exposure time for the ones of the plurality of pixels arranged side by side in the first direction by supplying the first control signal to the ones of the plurality of pixels arranged side by side in the first direction.

(9)

The imaging device according to any one of (1) to (8), in which each of the plurality of pixels is configured to output a pixel signal corresponding to an amount of light received by the light receiving element on a basis of a second control signal, and the drive section is configured to cause each of the ones of the plurality of pixels arranged side by side in the first direction to output the pixel signal by supplying the second control signal to the ones of the plurality of pixels arranged side by side in the first direction.

(10)

The imaging device according to any one of (1) to (8), in which each of the plurality of pixels is configured to output a pixel signal corresponding to an amount of light received by the light receiving element on a basis of a second control signal, and the drive section is configured to cause each of the ones of the plurality of pixels arranged side by side in the second direction to output the pixel signal by supplying the second control signal to the ones of the plurality of pixels arranged side by side in the second direction.

(11)

The imaging device according to any one of (1) to (7), in which the plurality of pixels is divided to be disposed in a plurality of regions arranged side by side in the first direction and the second direction, two or more of the pixels are disposed in each of the plurality of regions, and the drive section is configured to set exposure times for ones of the plurality of pixels disposed in ones of the plurality of regions arranged side by side in the first direction to a same time.

(12)

The imaging device according to (11), in which the drive section is configured to set exposure times for ones of the plurality of pixels disposed in ones of the plurality of regions arranged side by side in the second direction to times different from each other.

(13)

A spectrum analysis apparatus including:
a spectroscope;
a plurality of pixels disposed to allow light outputted by the spectroscope to enter, the plurality of pixels being arranged side by side in a first direction and a second direction and each including a light receiving element; and
a drive section configured to drive the plurality of pixels,
in which
pieces of light outputted by the spectroscope and having wavelengths different from each other are configured to enter ones of the plurality of pixels arranged side by side in the first direction,
pieces of light outputted by the spectroscope and having wavelengths equal to each other are configured to enter ones of the plurality of pixels arranged side by side in the second direction,
of the plurality of pixels, the ones arranged side by side in the first direction have respective light receiving sensitivities equal to each other, and
of the plurality of pixels, the ones arranged side by side in the second direction include a first pixel and a second pixel each having a light receiving sensitivity, the light receiving sensitivity of the first pixel and the light receiving sensitivity of the second pixel being different from each other.

This application claims priority from Japanese Patent Application No. 2018-132139 filed with the Japan Patent Office on Jul. 12, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device, comprising:
a plurality of pixels arranged side by side in a first direction and a second direction and each including a light receiving element; and
a drive section configured to drive the plurality of pixels, wherein
of the plurality of pixels, ones arranged side by side in the first direction have respective light receiving sensitivities equal to each other, and
of the plurality of pixels, ones arranged side by side in the second direction include a first pixel and a second pixel each having a light receiving sensitivity, the light receiving sensitivity of the first pixel and the light receiving sensitivity of the second pixel being different from each other.

2. The imaging device according to claim 1, wherein the ones of the plurality of pixels arranged side by side in the second direction include three or more pixels that have respective light receiving sensitivities different from each other.

3. The imaging device according to claim 2, wherein the respective light receiving sensitivities of the three or more pixels are each proportional to a power of 2.

4. The imaging device according to claim 1, wherein the ones of the plurality of pixels arranged side by side in the second direction include:
a third pixel having a light receiving sensitivity equal to the light receiving sensitivity of the first pixel and being adjacent to the first pixel in the second direction; and
a fourth pixel having a light receiving sensitivity equal to the light receiving sensitivity of the second pixel and being adjacent to the second pixel in the second direction.

5. The imaging device according to claim 1, wherein
the ones of the plurality of pixels arranged side by side in the first direction are configured to detect pieces of light having wavelengths different from each other, and
the ones of the plurality of pixels arranged side by side in the second direction are configured to detect pieces of light having wavelengths equal to each other.

6. The imaging device according to claim 1, wherein
the drive section is configured to drive the first pixel and the second pixel to cause a first exposure time for the first pixel and a second exposure time for the second pixel to be different from each other,
the light receiving sensitivity of the first pixel is a light receiving sensitivity corresponding to the first exposure time, and
the light receiving sensitivity of the second pixel is a light receiving sensitivity corresponding to the second exposure time.

7. The imaging device according to claim 1, further comprising a light-transmissive film, wherein
the light receiving element of each of the plurality of pixels is formed on a semiconductor substrate,
the light-transmissive film is formed on a light entrance surface of the semiconductor substrate,
the light-transmissive film has a first light-transmission degree in a region corresponding to the first pixel and a second light-transmission degree in a region corresponding to the second pixel, the first light-transmission degree and the second light-transmission degree being different from each other,
the light receiving sensitivity of the first pixel is a light receiving sensitivity corresponding to the first light-transmission degree, and
the light receiving sensitivity of the second pixel is a light receiving sensitivity corresponding to the second light-transmission degree.

8. The imaging device according to claim 1, wherein
the plurality of pixels is configured to perform an exposure operation on a basis of a first control signal, and
the drive section is configured to set an exposure time for the ones of the plurality of pixels arranged side by side in the first direction by supplying the first control signal to the ones of the plurality of pixels arranged side by side in the first direction.

9. The imaging device according to claim 1, wherein
each of the plurality of pixels is configured to output a pixel signal corresponding to an amount of light received by the light receiving element on a basis of a second control signal, and
the drive section is configured to cause each of the ones of the plurality of pixels arranged side by side in the first direction to output the pixel signal by supplying the second control signal to the ones of the plurality of pixels arranged side by side in the first direction.

10. The imaging device according to claim 1, wherein
each of the plurality of pixels is configured to output a pixel signal corresponding to an amount of light received by the light receiving element on a basis of a second control signal, and
the drive section is configured to cause each of the ones of the plurality of pixels arranged side by side in the second direction to output the pixel signal by supplying the second control signal to the ones of the plurality of pixels arranged side by side in the second direction.

11. The imaging device according to claim 1, wherein the plurality of pixels is divided to be disposed in a plurality of regions arranged side by side in the first direction and the second direction, two or more of the plurality of pixels are disposed in each of the plurality of regions, and the drive section is configured to set exposure times for ones of the plurality of pixels disposed in ones of the plurality of regions arranged side by side in the first direction to a same time.

12. The imaging device according to claim 11, wherein the drive section is configured to set exposure times for ones of the plurality of pixels disposed in ones of the plurality of regions arranged side by side in the second direction to times different from each other.

13. A spectrum analysis apparatus comprising:

a spectroscope;

a plurality of pixels disposed to allow light outputted by the spectroscope to enter, the plurality of pixels being arranged side by side in a first direction and a second direction and each including a light receiving element; and a drive section configured to drive the plurality of pixels, wherein pieces of light outputted by the spectroscope and having wavelengths different from each other are configured to enter ones of the plurality of pixels arranged side by side in the first direction, pieces of light outputted by the spectroscope and having wavelengths equal to each other are configured to enter ones of the plurality of pixels arranged side by side in the second direction, of the plurality of pixels, the ones arranged side by side in the first direction have respective light receiving sensitivities equal to each other, and of the plurality of pixels, the ones arranged side by side in the second direction include a first pixel and a second pixel each having a light receiving sensitivity, the light receiving sensitivity of the first pixel and the light receiving sensitivity of the second pixel being different from each other.

\* \* \* \* \*